(12) United States Patent  
Owsley et al.

(10) Patent No.: US 8,610,607 B2  
(45) Date of Patent: Dec. 17, 2013

(54) ASSIGNING CODES TO AND REPAIRING HUFFMAN TREES

(75) Inventors: Patrick Owsley, Moscow, ID (US); Brian A. Banister, Moscow, ID (US); Jason Franklin, Moscow, ID (US)

(73) Assignee: Comtech EF Data Corp., Tempe, AZ (US)

( * ) Notice: Subject to any disclaimer, the term of this patent is extended or adjusted under 35 U.S.C. 154(b) by 171 days.

(21) Appl. No.: 13/363,226

(22) Filed: Jan. 31, 2012

(65) Prior Publication Data

US 2012/0127001 A1 May 24, 2012

Related U.S. Application Data

(63) Continuation of application No. 12/124,960, filed on May 21, 2008, now Pat. No. 8,106,797.

(60) Provisional application No. 60/991,572, filed on Nov. 30, 2007.

(51) Int. Cl.  
*H03M 7/40* (2006.01)

(52) U.S. Cl.  
USPC .............................................. 341/67; 341/65

(58) Field of Classification Search  
USPC .......................... 341/67, 65, 50, 51; 709/247  
See application file for complete search history.

(56) References Cited

U.S. PATENT DOCUMENTS 8,106,797 B2 * 1/2012 Owsley et al. .................. 341/67

* cited by examiner

*Primary Examiner* — Joseph Lauture  
(74) *Attorney, Agent, or Firm* — Booth Udall Fuller, PLC

(57) ABSTRACT

A method for assigning codes to Huffman trees and repairing invalid Huffman trees is disclosed using a calculated delta and moving nodes within the Huffman tree by adjusting their encode register entries.

20 Claims, 22 Drawing Sheets

ASSIGNING CODES TO AND REPAIRING HUFFMAN TREES

PRIORITY AND RELATED APPLICATIONS

This application is a continuation of the earlier patent application entitled "Assigning Codes to and Repairing Huffman Trees," Ser. No. 12/124,960 to Owsley et al., filed May 21, 2008, now issued as U.S. Pat. No. 8,106,797, which claims the benefit of priority to U.S. provisional application Ser. No. 60/991,572 to Owlsey et al., entitled "Generating Dynamic Huffman Codes and Repairing Huffman Code Trees," filed Nov. 30, 2007, the disclosures of which are hereby incorporated herein by reference.

BRIEF DESCRIPTIONS OF THE DRAWINGS

Tools and techniques related to generating dynamic Huffman codes and repairing Huffman code trees are described in connection with the following drawing figures. The same numbers are used throughout the disclosure and figures to reference like components and features. The first digit in a reference number indicates the drawing figure in which that reference number is introduced.

DETAILED DESCRIPTION

Overview

The following document describes systems, methods, user interfaces, and computer-readable storage media (collectively, "tools") that are capable of performing and/or supporting many techniques and processes. The following discussion describes exemplary ways in which the tools generate dynamic Huffman codes and repair Huffman code trees. This discussion also describes other techniques and/or processes that may be performed by the tools.

FIG. 1

Figure 1:
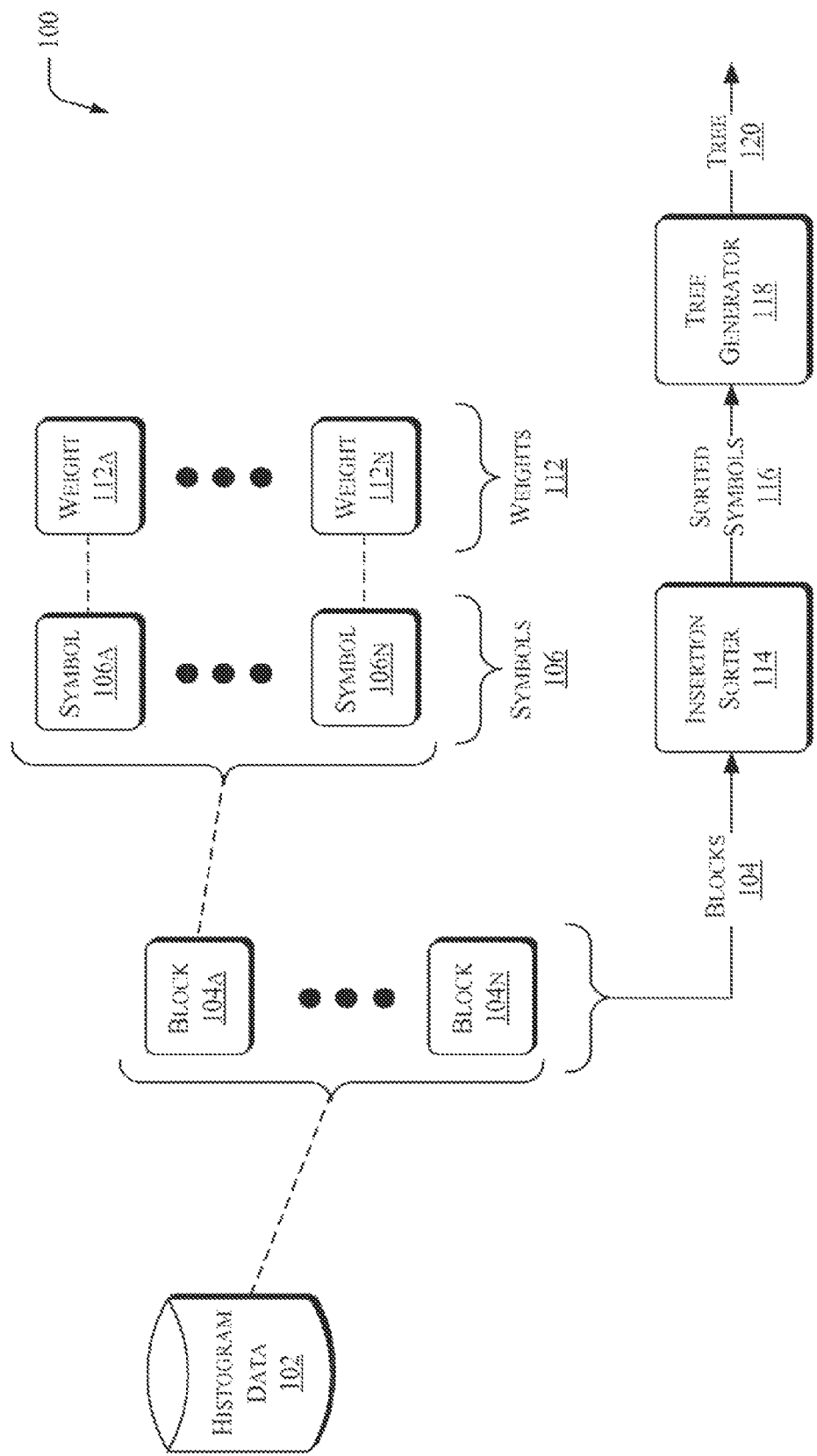
FIG. 1 is a combined block and flow diagram illustrating examples of systems or operating environments in which the tools described herein may generate dynamic Huffman codes and related trees.

FIG. 1 illustrates examples of systems or operating environments 100 in which the tools described herein may generate dynamic Huffman codes. Block 102 represents storage of statistical or histogram data indicating how often given symbols occur within given blocks of data to be dynamically encoded. This data may include a plurality of blocks, denoted generally at 104. FIG. 1 shows examples of two blocks at 104a and 104n, but implementations of the operating environments may include any number of blocks.

Individual blocks 104 may include a plurality of un-encoded symbols, denoted generally at 106. FIG. 1 shows examples of two symbols at 106a and 106n, but implementations of the operating environments may include any number of symbols. In general, the blocks 104 represent collections of symbols 106 that are processed, encoded, and handled as logical units.

When blocks of these symbols are to be encoded, they may be statistically analyzed to determine how many times different symbols occur within the block. Put differently, for each symbol that occurs at least once in the block, the statistical analysis computes how frequently this symbol occurs in the block. FIG. 1 represents the results of this statistical analysis generally at 102.

The frequencies at which different symbols occur may be expressed as a weight parameter associated with the different symbols. The more frequently that a given symbol occurs in a block, the higher the weight assigned to the symbol. The less frequently that a given symbol occurs in a block, the lower the weight assigned to the symbol. In the examples described herein, the weights assigned to the symbols occurring within a give block may sum to 1.0. However, this description is non-limiting and provided only as an example. Any number of different weighting schemes may be suitable in different possible implementations. For example, while the examples provided herein pertain to weights expressed in floating point formats, implementations may use floating point, integer, or other convenient forms of arithmetic.

FIG. 1 represents these weights generally at 112. FIG. 1 illustrates two examples of weights, denoted at 112a and 112n. After a statistical analysis of the blocks (not shown explicitly in FIG. 1), the symbols 106 that occur in the given block (e.g., 104a) are associated with a respective weight. In the example shown in FIG. 1, the symbol 106a has an assigned weight 112a, and the symbol 106n has an assigned weight 112n.

Once the weights 112 are assigned for the various symbols 106 in the blocks 104, the blocks may be forwarded to an insertion sorter 114. In general, the insertion sorter may operate to receive blocks of symbols, and insert the symbols into a suitable data structure, as described in detail below. FIG. 1 shows an example in which the insertion sorter 114 produces a set of sorted symbols, denoted at 116.

The systems 100 may include a tree generation unit 118 that receives blocks of sorted symbols 116, and generates respective dynamic Huffman codes and related trees for these blocks of symbols. FIG. 1 denotes examples of the output Huffman trees at 120.

The Huffman codes generated using the techniques described here are described as "dynamic," in the sense that different blocks are encoded using different coding schemes. Thus, the statistical data storage 102 may include respective histogram data for each different block 104. Symbols appearing within different blocks may be assigned different weights in those different blocks, depending on how frequently these symbols occur in those different blocks. As detailed further below, these different weights assigned to the symbols may result in the same symbol being encoded differently in different blocks. Thus, a given symbol occurring in a first given block (e.g., 104a) may be encoded with a given bit string within that first block. However, if that given symbol occurs in a second given block (e.g., 104n), the bit string to which the symbol is encoded may be different.

FIG. 2

Figure 2:
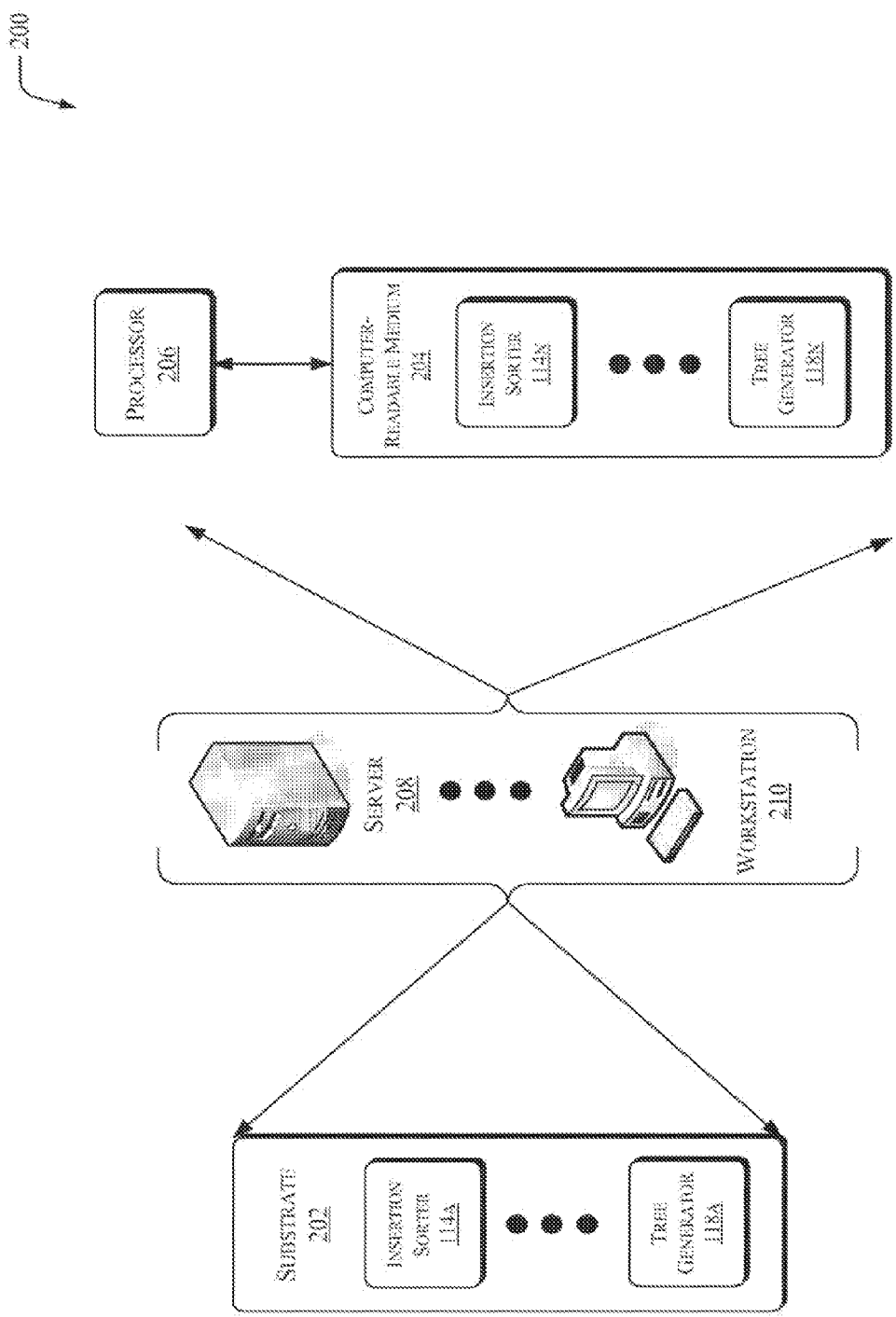
FIG. 2 is a block diagram illustrating different possible implementations of an insertion sorter and a tree generator used to generate dynamic Huffman codes.

FIG. 2 illustrates different possible implementations, denoted generally at 200, of an insertion sorter and tree generator used to generate dynamic Huffman codes. For convenience and conciseness of description, but not to limit possible implementations, some items described previously are carried forward into FIG. 2 and denoted by the same reference numbers.

As shown in FIG. 2, the insertion sorter and tree generator may be implemented in hardware and/or software. In hardware-based implementations, the insertion sorter and tree generator, as well as other elements described herein, may be implemented in circuit form. Hardware implementations of the insertion sorter and tree generator are denoted, respectively, at 114a and 118a. These hardware implementations may reside in or on substrates 202. Examples of such substrates may include printed circuit boards, chip dies, or the like. As such, these hardware implementations may include one or more integrated circuits connected to printed circuit boards, may include modules that are resident on-board with microprocessor units, or in other environments.

In software-based implementations, the insertion sorter and tree generator may be implemented as one or more software modules that may reside in one or more instances of computer-readable storage media 204. FIG. 2 denotes software implementations of the insertion sorter and stack at 114n and 118n, respectively. These software modules may include sets of computer-executable instructions that may be loaded into one or more processors 206 and executed. When executed, these instructions may cause the processor, and any machine containing the processor, to perform any of the various functions described herein.

FIG. 2 also provides non-limiting examples of systems within which the substrates 202 and/or computer-readable media 204 may reside. A server-based system 208 may include the substrates 202 and/or computer-readable media 204. The server 208 may, for example, process media or other data to be encoded, as represented generally at 102 in FIG. 1. In other instances, the server 208 may enable development, testing, or simulation of the various tools and techniques described herein. As such, the server 208 may be accessible by one or more remote users (not shown in FIG. 2).

FIG. 2 also illustrates a workstation system 210 in which the substrates 202 and/or computer-readable media 204 may reside. Like the server 208, the workstation system 210 may process media or other data to be encoded, or may enable development, testing, or simulation of the various tools and techniques described herein.

FIG. 3

Figure 3:
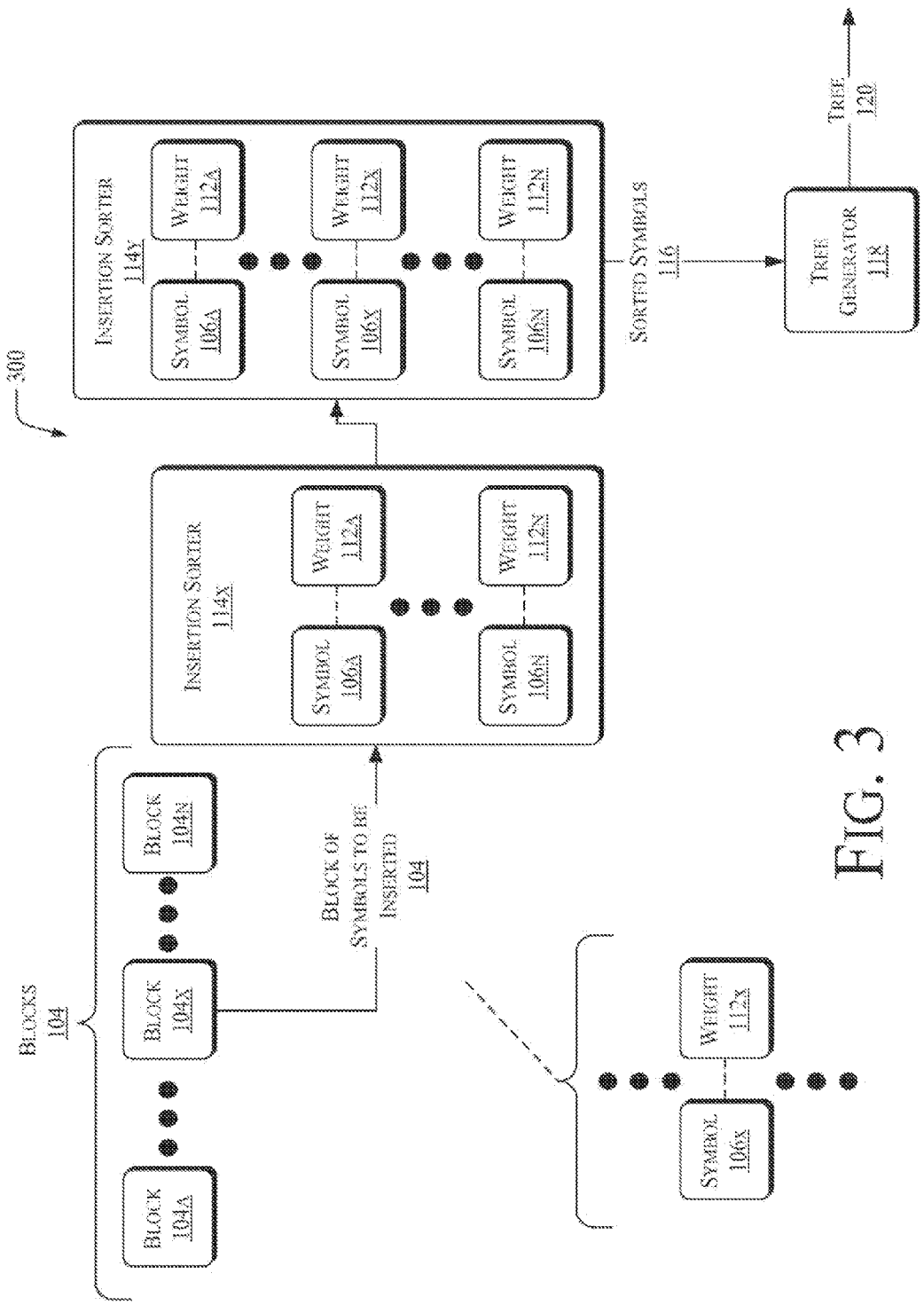
FIG. 3 is a combined block and flow diagram illustrating operation of the insertion sorter in loading and sorting new symbols into a data structure to facilitate the processing further described below.

FIG. 3 illustrates an operation 300 of an insertion sorter in loading and sorting new symbols into a data structure to facilitate the processing further described below. For convenience and conciseness of description, but not to limit possible implementations, some items described previously are carried forward into FIG. 3 and denoted by the same reference numbers.

Examples of an insertion sorter are denoted at 114. More specifically, FIG. 3 provides examples of how the insertion sorter evolves as a new symbol 114x is loaded into the sorter. As described previously, blocks 104 of symbols 106 to be encoded may arrive for processing at the insertion sorter 114. FIG. 3 generally represents a given symbol to be inserted at 106x. This symbol 106x may be associated with a weight 112x, which indicates how frequently the symbol occurs within the instant block 104.

FIG. 3 generally represents at 114x an example (but non-limiting) state of the insertion sorter when the new symbol 106x arrives. In this example state, the insertion sorter 114x may already contain entries for two symbols 106a and 106n, with associated weights 112a and 112n. When the new symbol 106x arrives, the insertion sorter may push the new symbol 106x into the top-of-stack (TOS) position in the insertion sorter 116. The insertion sorter may compare the weight 112x of the new symbol 106x with the weights of any symbols already in the stack to determine where in the insertion sorter the new symbol should be placed. In some instances, the insertion sorter may be sorted in ascending order of weight, with the lowest-weighted symbols closer to the top of the insertion sorter. In other instances, the insertion sorter may be sorted in descending order of weight, with the highest-weighted symbols closer to the top of the insertion sorter.

Depending on how the insertion sorter is implemented, the sorter may place the new symbol 106x into the appropriate location within the sorter, based on how its weight 112x compares to the weights of any symbols already in the sorter (e.g., symbols 106a and 106n, with weights 112a and 112n). Assuming that the weight 112x of the new symbol 106x falls between the weights 112a and 112n of the existing symbols, the new symbol 106x may be located in the sorter between the existing symbols 106a and 106n. FIG. 3 represents, at 114y, the state of the sorter after it has pushed-in the new symbol 106x and sorted to accommodate the symbol in its appropriate position.

It is noted that the scenario shown at 114x is non-limiting, and the insertion sorter may contain zero or more entries for previously-pushed symbols. For example, if the sorter is empty when the new symbol 106x arrives, the insertion sorter may push the new symbol 106x into the top-of-stack position, and then await the arrival of the next symbol 106. In this case, the sorting operation would be superfluous, since the stack contains only one entry.

When all symbols from the input block 104 have been pushed into the insertion sorter, the sorter may pass the sorted symbols 116 to the tree generator 118. In turn, the tree generator may produce the output tree 120. It is noted that the description herein uses the term "push" (and variations thereof) only for ease of description, but not to limit possible implementations. More specifically, the term "push" does not limit such implementations to stack-type structures. Instead, any suitable structure may be appropriate in different implementations.

FIG. 4

Figure 4:
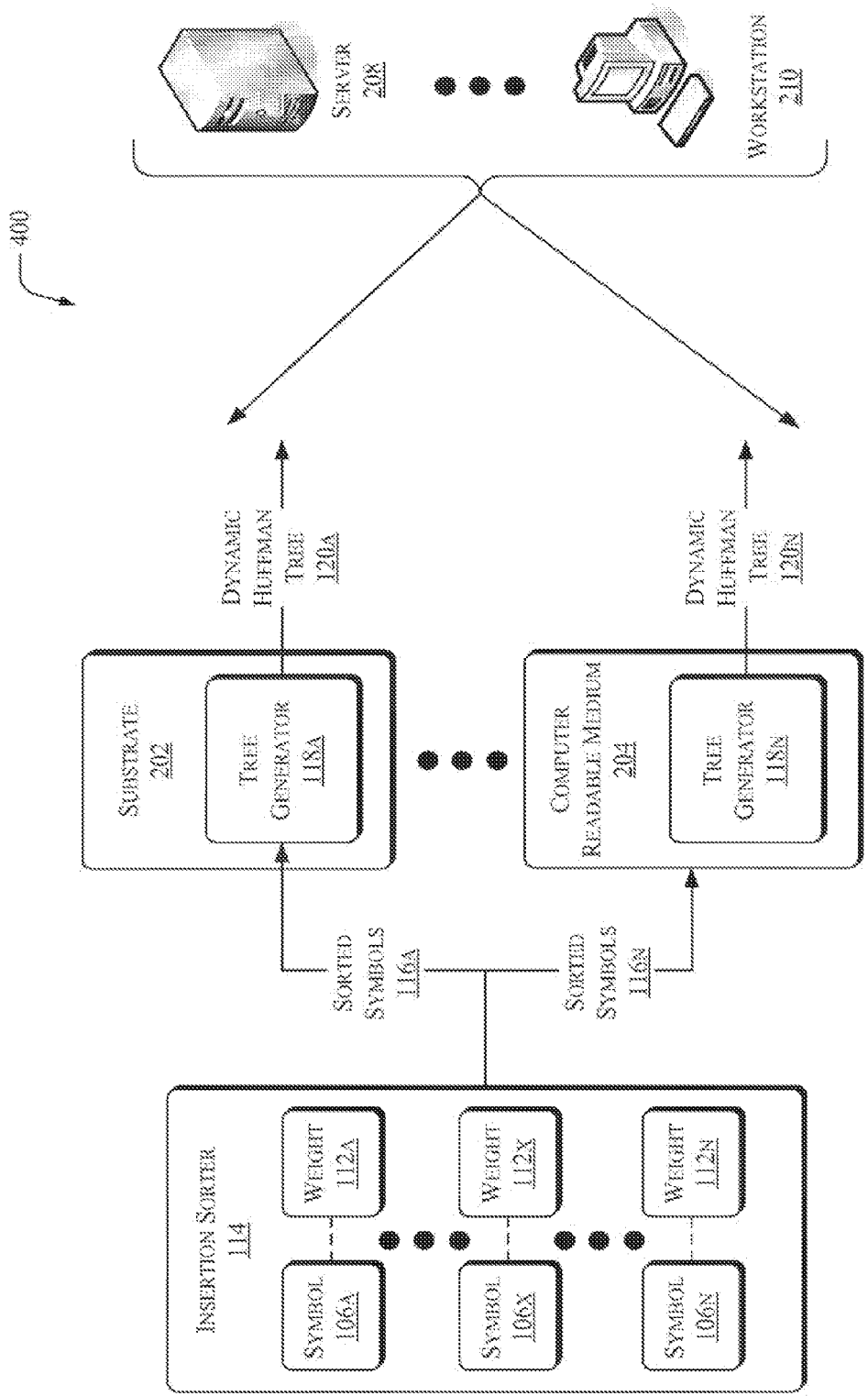
FIG. 4 is a combined block and flow diagram illustrating different implementations of the insertion sorter and the tree generator component, as suitable for generating dynamic Huffman codes.

FIG. 4 illustrating different implementations 400 of an insertion sorter and a tree generator component suitable for generating dynamic Huffman codes. For convenience and conciseness of description, but not to limit possible implementations, some items described previously are carried forward into FIG. 4 and denoted by the same reference numbers.

An insertion sorter, such as the sorter 114, may contain any number of symbols 106 that are sorted according to their respective weights 112. For convenience of description only, FIG. 4 carries forward the sorter 114 in its state as shown at 114y in FIG. 3, with three symbols 106a-n sorted according to their respective weights 112a-n. The sorter, when fully loaded, may contain all of the symbols occurring in a given block of data (e.g., 102 in FIG. 1).

A tree generator component, carried forward at 118 may extract the sorted symbols, denoted generally at 116, to generate dynamic Huffman codes for the symbols. The tree generator component may include a hardware circuit implementation 118a that may reside on the substrate (e.g., 202). The sorted symbols as input to such a circuit are denoted at 116a. The tree generator component may also include a software implementation denoted at 118n that may reside on the computer-readable storage medium (e.g., 204). The sorted symbols as input to such software are denoted at 116n. In either of the example implementations, a server (e.g., 208), a workstation (e.g., 210), or other systems may include the tree generator component 118.

FIG. 4 denotes generated dynamic Huffman codes and related trees generally at 120. More specifically, dynamic Huffman codes generated by hardware implementations are denoted at 120a, while dynamic Huffman codes generated by software implementations are denoted at 120n.

FIG. 5

Figure 5:
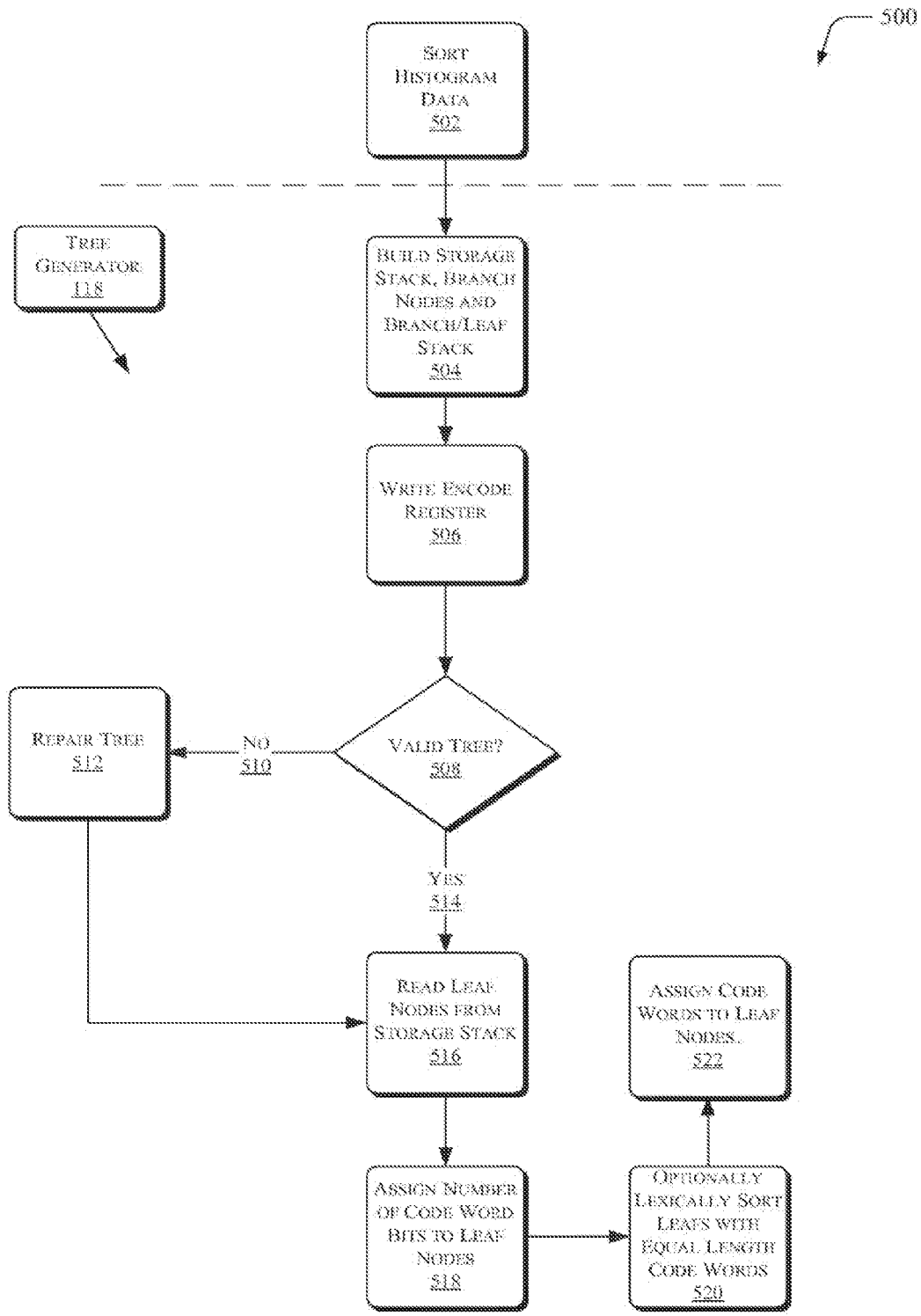
FIG. 5 is a combined block and flow diagram illustrating process flows for generating code words for the input symbols.

FIG. 5 illustrates process flows 500 for generating code words for the input symbols. More specifically, the process flows 500 elaborate further on illustrative processing that the tree generator component 118 may perform. For convenience and conciseness of description, but not to limit possible implementations, some items described previously are carried forward into FIG. 5 and denoted by the same reference numbers.

Block 502 represents sorting histogram data (e.g., 102) by weight/frequency. Block 502 may include using an insertion sorter (e.g., 114), as described above. In different implementations, the process flows 500 may sort heaviest weight/highest frequency symbols to the bottom of the sorter, or may sort heaviest weight/highest frequency symbols to the top of the sorter. The symbols loaded into the sorter will become the leaf nodes in the final tree, so this description refers to the symbols as leaf nodes.

Block 504 represents building the storage stack and branch/leaf list. The storage stack may be implemented as an inverted stack derived from the initial insertion sorter, with neither having branch nodes. The branch/leaf list may be implemented as a stack that contains the number of consecutive branches from the insertion sorter, followed by the number of consecutive leaf nodes from the insertion sorter as the tree is build bottom up. Block 504 may repeat until the branch/leaf list contains all the leaf nodes from the insertion sorter. Put differently, the branch/leaf list may contain the number of leafs and branches on each level of the tree.

In more detail, block 504 may include popping two items from the top of the insertion sorter, summing their weight to form a branch node, and pushing the branch onto the insertion sorter. If either of the items popped from the sorter are leaf nodes, block 504 may include pushing them onto the storage stack. Branch nodes are not pushed onto the storage stack; however, they are counted in the construction of the branch/leaf list.

Block 504 may include constructing the branch/leaf list as follows:
 a) when the first two leaf nodes are popped from the insertion sorter, set the leaf count register to two;
 b) continue to increment the leaf count register as leaf nodes are popped of the sorter, until a branch node is reached;
 c) when a branch node is reached, push the leaf count value onto the branch/leaf list stack, clear the leaf count register, and increment the branch count register;
 d) continue to increment the branch count register as branch nodes are popped from the sorter, until a leaf node is reached;
 e) when a leaf node is reached, push the branch count value onto the branch/leaf list stack, clear the branch count register, and increment the leaf count register; and
 f) return to sub-process b) above. Continue until insertion sorter is empty Block 506 represents writing and/or filling an encode register, which may include a register for each level of the tree being constructed. When the block 506 completes, the encode register contains the number of leaf nodes on each level of the tree. Block 506 may include processing the branch/leaf list to determine how many leaf nodes are to occur on each level of the tree. The tree may be built in top-down fashion, starting with the highest index value down to the index zero at the bottom of the tree. Since the top of the tree has one branch node, no register is required. The next level down the tree has two nodes.

Figure 21:
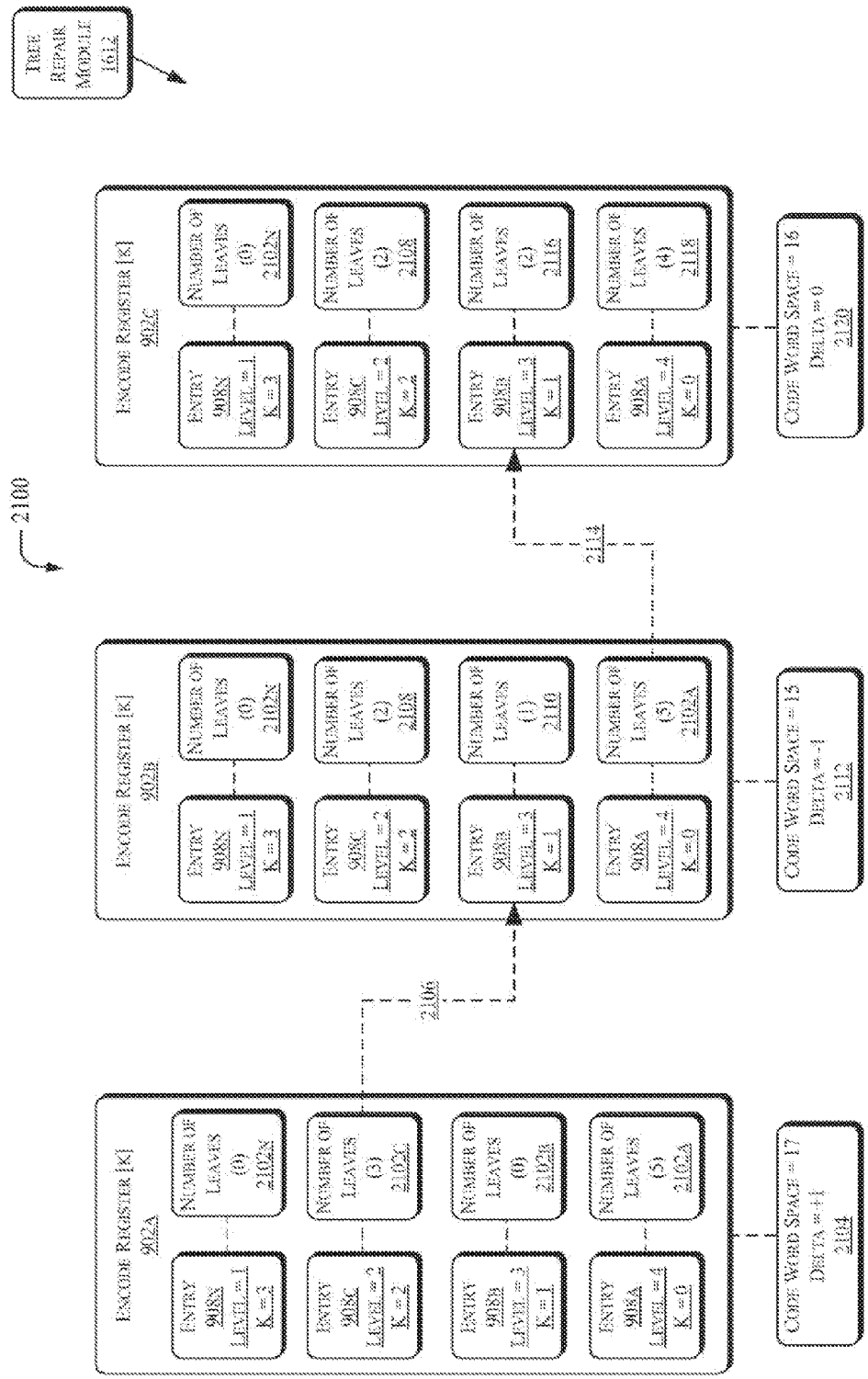
FIG. 21 is a sequence diagram illustrating how the contents of the encode register may be altered to implement the tree repairs.

Block 506 may include:
 a) Determining the number of nodes for a current level of the tree. The number of nodes is twice the number of branch nodes on the level above the current level. Block 506 may include storing this value in a register that represents a number of nodes that are available on this current level.
 b) Popping the top entry off the branch/leaf list (assuming the branch-leaf list is not empty. This entry will indicate either a number of branch nodes or a number of leaf nodes.
 c) Assign the available nodes as leaves or branches, according to what was popped off the branch/leaf stack, and decrement the available nodes each time an entry is popped from the branch/leaf list. If the entry from the branch/leaf list is used up, pop the next entry off the branch/leaf list. Continue until all the available nodes for this level are assigned, popping entries from the branch/leaf list as appropriate. In an example implementation, block 506 may include only storing the leaf count in the encode register for this current level. Additionally, block 506 may include storing the branch count in a register that is used for calculating the number of available nodes on the next lower level of the tree.

d) Return to sub-process a) to start the process of determining the number of leaf nodes for the next encode register, which represents the next level of the tree. Continue this process until the branch-leaf list is empty Block 508 represents checking for a valid tree, based on the depth or levels of the tree. If the tree exceeds a maximum permitted level or depth, the process flows 500 may take No branch 510 to block 512, which represents repairing the tree. FIG. 21 below illustrate techniques for repairing trees, and the description of these drawings elaborates further on block 512.

Returning to block 508, if the tree is valid, the process flows 500 may take Yes branch 514 to block 516, which represents reading leaf nodes from the storage stack. The process flows 500 may also reach block 516 after repairing an illegal tree in block 512. In turn, block 518 represents assigning the number of bits that will be used to represent leaf nodes at the current tree level, and block 520 represents writing these numbers of bits to the insertion sorter. More specifically, blocks 518-520 may include:

a) Initializing the encode register index, k, to the maximum tree levels minus 1 (codewidth−1), and reading the encoding register. If the value is zero, decrement the index and read the next encode register. Continue until a non-zero value is found. Note that in an example implementation, this process may start with the highest index because the top of the storage stack has the heaviest/most frequent leaf node. Other implementations could perform this process in reverse.

b) Pop a leaf node from the storage stack, and prepend the number of bits used to encode the leaf node. Push the leaf node onto the insertion sorter, and continue until the count decrements to zero. The insertion sorter is not required for generic Huffman trees (i.e., trees that are not subject to additional constraints, understood in the context of GZIP). Some formats (e.g., GZIP) specify that items on the same tree level be sorted lexically.

c) Decrement the index and read the next encode register. Continue until a non-zero entry is found. Calculate the number of bits with which to encode leaves for this level by subtracting the index from the maximum number of levels in the tree.

d) Return to sub-process b) above, unless the stack is empty, at which point this process ends.

Block 522 represents assigning codewords to each element in the insertion sorter. More specifically, block 522 may include:

a) initializing a current code word value to zero. Recall from the previous description that the number of bits for a given code word was previously stored in the insertion sorter;

b) popping the top two leaf nodes from the sorter. In some example implementations, the sorter may be designed to pop two items at a time. However, in other example implementations, the sorter may be designed to pop one item at a time;

c) pushing the second item back onto the sorter;

d) assigning the code word value to the leaf popped from the sorter. The level bits that were popped with the leaf define the number of bits used for the code word value. Recall that the number of bits was previously prepended to the leaf node as it was pushed into the sorter;

e) outputting the leaf, the level bits, and the codeword value;

f) if the sorter is not empty, continuing with the following actions:

g) incrementing the codeword value;

h) popping the next two items from the sorter and pushing the second back onto the sorter;

i) if the number of bits in the level field has increased, left shifting the codeword value;

j) assigning the codeword value to the leaf;

k) returning to sub-action e) above.

Using the foregoing actions, block 522 may output all elements (e.g., leaf nodes) that were encoded by the Huffman code. Block 522 may include outputting the elements with the codeword that represents them and with the number of bits used by the codeword.

FIG. 6

Figure 6:
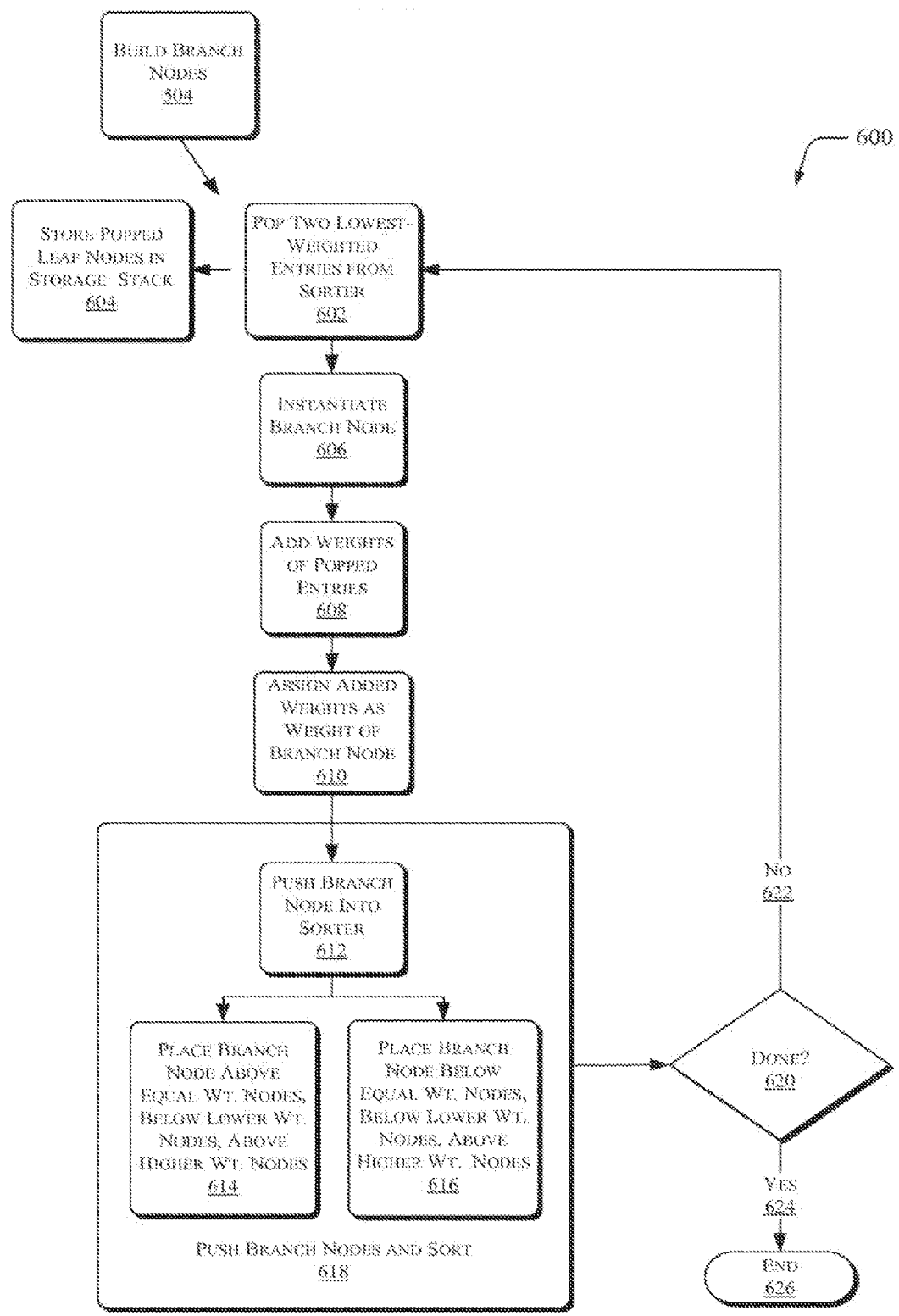
FIG. 6 is a flow diagram illustrating processes for generating dynamic Huffman codes.

FIG. 6 illustrates processes 600 for generating branch nodes and pushing leaf nodes into a storage stack as they are popped from the insertion sorter. For convenience and conciseness of description, but not to limit possible implementations, some items described previously are carried forward into FIG. 6 and denoted by the same reference numbers. Additionally, while the processes 600 are described in connection with certain components and systems identified herein, it is noted that at least some of the processes may be performed with other components and systems without departing from the spirit and scope of the description herein. Finally, the order in which FIG. 6 presents various processing or decision blocks is chosen only for ease of description, but not to limit possible implementations.

The processes 600 shown in FIG. 6 may be performed by, for example, a branch node generator component (e.g., 504 in FIG. 5). More specifically, the branch node generator component may, for example, perform the processes 600 to build branch nodes in connection with generating the dynamic Huffman code.

Block 606 represents instantiating a branch node element for the two entries popped off of the sorter in block 602. This branch node element may then be pushed into the insertion sorter as detailed further below.

Block 608 represents adding the weights of the two entries popped from the sorter in block 602.

Block 610 represents assigning the added weights of the two popped entries as the weight of the branch node element that was instantiated in block 602.

Block 612 represents pushing the branch node element into the sorter. In effect, the branch node element replaces the two popped entries in the sorter, as illustrated and discussed below in FIG. 6.

The sorter Block 612 can be implemented to sort with the highest weight nodes on the bottom or with the highest weight nodes on the top depending on whether nodes will be removed from the top or the bottom. The example Block 618 sorts with the highest weight nodes on the bottom, and nodes are removed from the top. A different implementation can sort with the highest weight on top, with nodes removed from the bottom.

In addition, if a branch is equal in weight to other nodes in the sorter, it may be placed above the nodes of equal weight, 614. Or, in a different implementation, it may be placed below nodes of equal weight, 616.

In different instances, the weight of the branch node element may or may not equal the weight of one or more other elements in the sorter. Whether the weight of the branch node element equals the weight of any existing entries in the sorter may impact how the stack is reordered or resorted, after the new branch node is pushed in.

In some implementations, reordering the sorter (block 618) may include placing the branch node above these one or more existing leaf nodes of weight equal to the branch node, as represented by block 614. Block 614 may also include placing the new branch node below any existing nodes having lower weights than the new branch node, and/or above any existing nodes having higher weights than the new branch node. In other implementations, reordering the sorter (block 618) may include placing the branch node below these one or more existing leaf nodes having weight equal to the branch node, as represented by block 616. Block 616 may also include placing the new branch node below any existing nodes having lower weights than the new branch node, and/or above any existing nodes having higher weights than the new branch node. It is noted that the terms "above" and "below" are used in this description for ease of description, but not to limit possible implementations.

Whether the branch node is placed below or above these existing entries of equal weight may have consequences on the dynamic Huffman codes that are generated. More specifically, different Huffman trees may result in different implementations of the process 600, depending on which of blocks 614 and 616 are chosen. FIGS. 8-11 provide examples of tree construction and code generation resulting from choosing block 614, while FIGS. 12-15 provide examples of tree construction and code generation resulting from choosing block 616.

If the weight of the branch node is not equal to any other existing entries in the sorter, then the process 600 may reorder the sorter by placing the branch node within the sorter based on the weight of the branch node, where this weight is not equal to any other entries in the sorter and may include placing the new branch node below any existing nodes having lower weights than the new node, and/or above any existing nodes having higher weights than the new node.

After performing 618, the process 600 may proceed to decision block 620, which represents evaluating whether the processes 600 are complete. For example, block 620 may include determining whether the weight of the branch node in the sorter indicates that the sorter has been fully processed. In the floating-point example described herein, the weights of the symbols in a given block are defined so that they sum to 1.0. In this example implementation, when the weight of the new branch node being pushed onto the sorter is 1.0, this indicates the end of the process 600. However, this scenario is non-limiting, and the actual value of the weight tested for in block 620 may vary from 1.0. Other implementations may forego the overhead associated with floating point arithmetic, in favor of integer operations, with block 620 testing for a particular weight, expressed as an integer. In still other examples, block 620 may terminate the process 600 when the last entry is popped from the sorter, and the sorter thus becomes empty. Other techniques for determining when the sorter is empty may be equally appropriate.

Continuing with these example implementations, from block 620, if the sorter is not yet fully processed, the process 600 may take No branch 622 to return to block 602, to repeat the process 600 with the sorter in its updated state. However, if the process 600 is complete, and the sorter is now fully processed, the process 600 may take Yes branch 624 to block 626, which represents designating the branch node currently being processed as the root node of the output tree being constructed (e.g., 120).

Block 626 represents an end state of the process 600. Having completed processing the sorter for a given block of symbols, the process 600 may wait in block 626 for the arrival of a next block of symbols. When the next block of symbols arrives, the process 600 may process this next block, beginning at block 602.

FIG. 7

Figure 7:
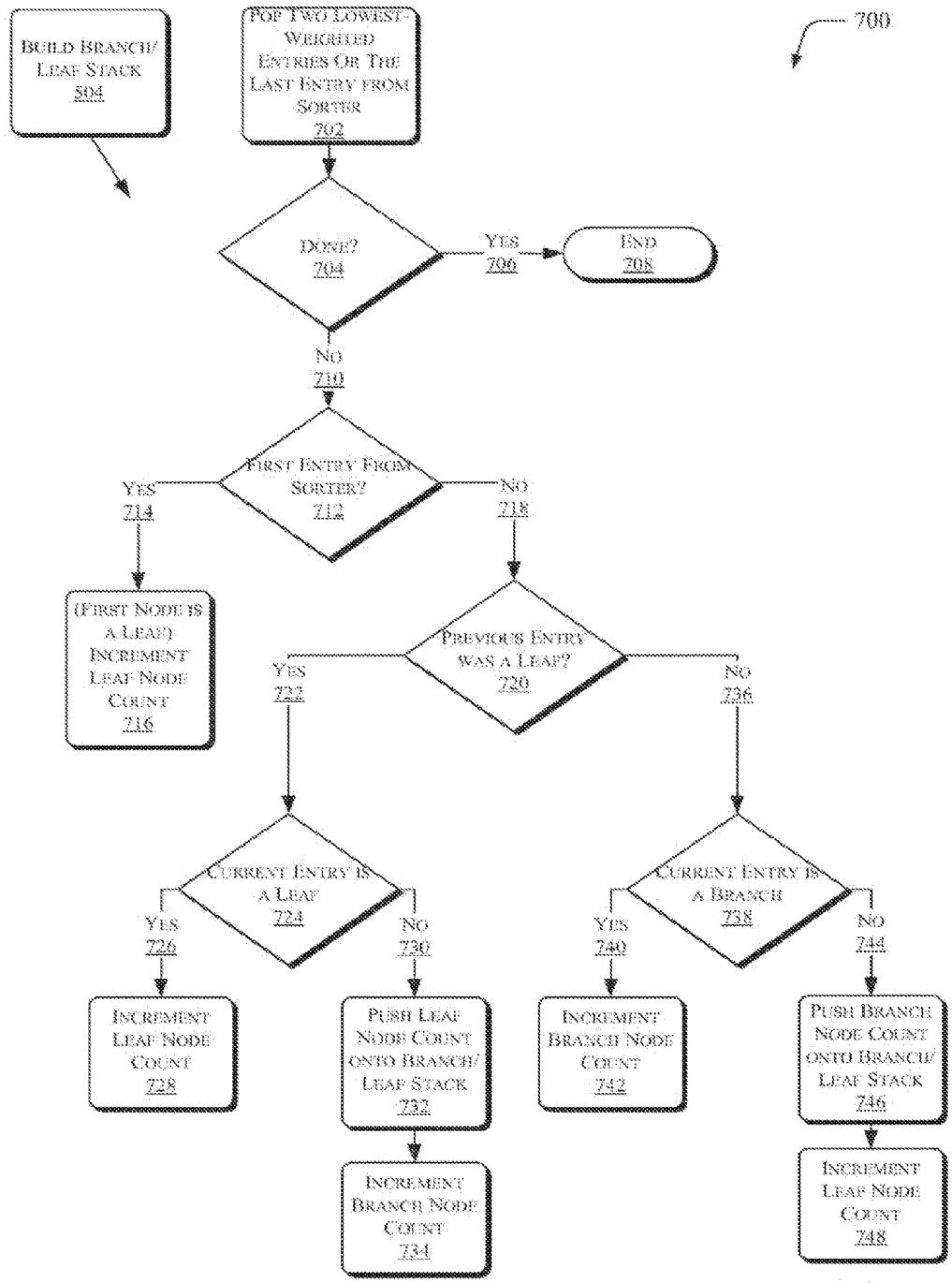
FIG. 7 is a flow diagram illustrating processes for building a branch and leaf stack and incrementing counters.

FIG. 7 is a flow diagram illustrating processes 700 for building a branch and leaf stack and incrementing counters. For convenience and conciseness of description, but not to limit possible implementations, some items described previously are carried forward into FIG. 7 and denoted by the same reference numbers. For clarity, but not to limit possible implementations, FIG. 7 shows the branch/leaf stack built one node at a time; however, it can be built one, two, or more nodes at a time as needed. Two nodes at a time is a good option as two nodes are popped from the sorter for building branch nodes. After popping the two lowest-weighted entries or the last entry from the sorter 702, if the process is done the Yes 706 branch is taken from 704. If the process is not done, the No 710 branch is taken from 704. Following the No 710 branch, the entry is checked to determine if it is the first entry from the sorter 712. If the Yes branch 714 is taken the leaf node count is incremented 716.

If the No branch 718 is taken the entry is checked to determine if the previous entry was a leaf 720. If Yes branch 722 is taken and if the current entry is a leaf 724 then the Yes branch 726 is taken and the leaf node count is incremented 728. Returning to 724, if the current entry is not a leaf, the No branch 730 is taken and the leaf node count is pushed onto branch/leaf stack 732 and the branch node count is incremented 734.

Returning to 720, if the previous entry was not a leaf, the No branch 736 is taken to block 738, where it is determined if the current entry is a branch. If the current entry is a branch 738, the Yes branch 740 is taken and the branch node count is incremented 742. If the current entry is not a branch 738, the No branch 744 is taken and a branch node count is pushed onto the branch/leaf stack 746 and the leaf node count is incremented 748.

FIG. 8

Figure 8:
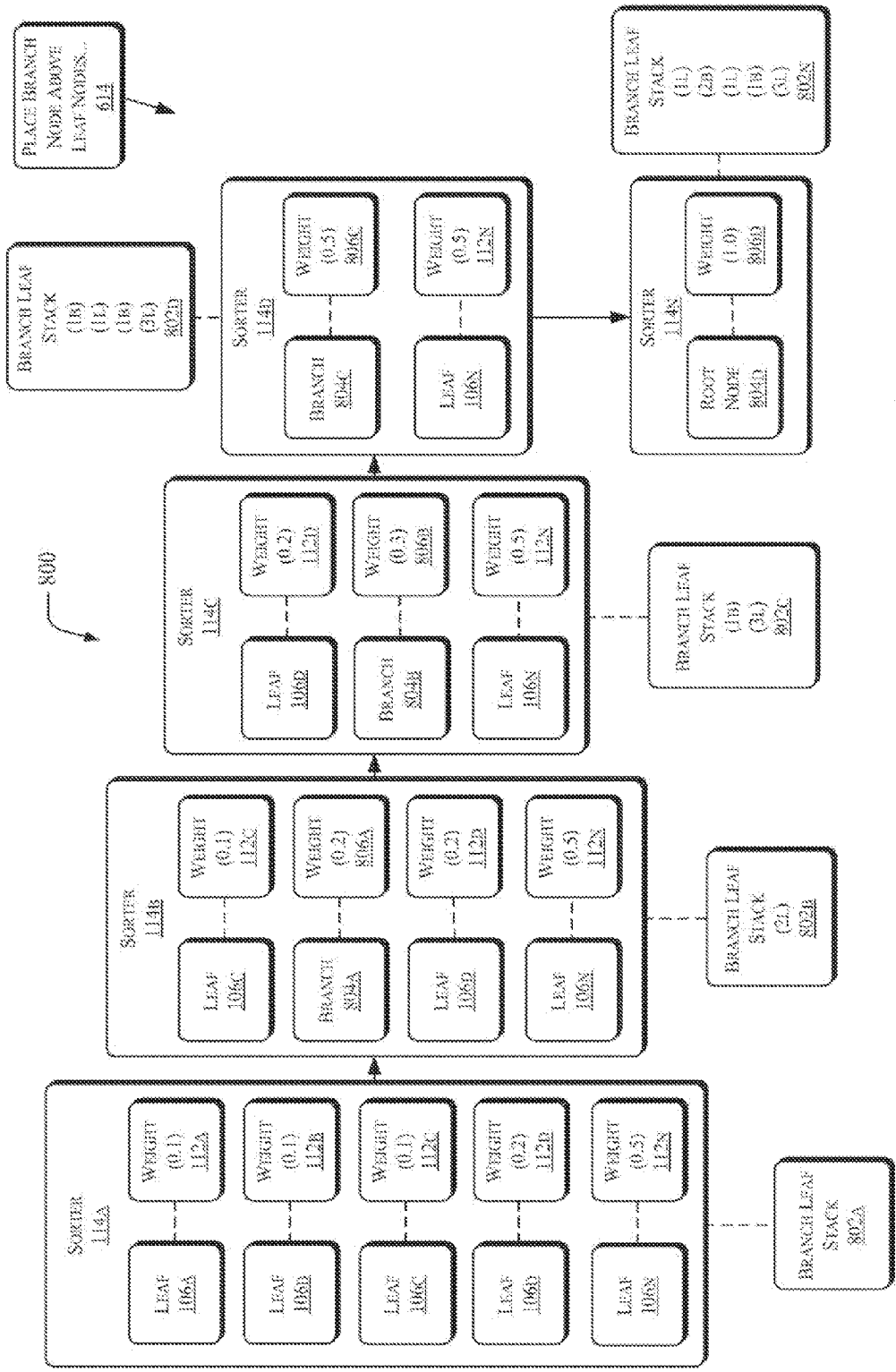
FIG. 8 is a sequence diagram illustrating states through which the sorter and branch/leaf stack may progress as the branch nodes and branch/leaf stack are generated.

FIG. 8 illustrates examples 800 of states through which a sorter (e.g., 114) and branch/leaf stack may progress as dynamic Huffman codes are generated. For convenience and conciseness of description, but not to limit possible implementations, some items described previously are carried forward into FIG. 8 and denoted by the same reference numbers. The progression of states shown in FIG. 8 may indicate how the sorter and branch/leaf stack may evolve as dynamic Huffman codes are generated. FIG. 6 shows an example of such a process at 600; however, the process 600 is non-limiting.

In an initial or beginning state, shown at 114*a*, the sorter is assumed to contain five symbols, or leaves, denoted respectively at 106*a*, 106*b*, 106*c*, 106*d*, and 106*n*. In this example, a given block of symbols (e.g., 104 in FIG. 1) is assumed to contain instances of five symbols (e.g., 106). Further, a statistical analysis of the symbols may indicate how frequently the symbols occur in the block. Additionally, the symbols are assigned weights according to their respective frequencies of occurrence. In the example shown in FIG. 8, the leaves 106*a*, 106*b*, 106*c*, 106*d*, and 106*n* as associated with respective weights 112*a*, 112*b*, 112*c*, 112*d*, and 112*n*. These weights 112 may take the respective values of 0.1, 0.1, 0.1, 0.2, and 0.5, as shown in block 116*a* of FIG. 8.

The description herein provides this specific example of symbols and weights only for ease of understanding, but not to limit possible implementations. Instead, such implementations may include any number of symbols, and may include any suitable weighting scheme.

The sorter 114 is assumed to be sorted by weights in ascending order, such that the lowest-weighted symbols are at the top of the sorter. In the example shown at 116a, the three lowest-weighted symbols are 106a, 106b, and 106c, all of which have the weight 0.1. This indicates that the symbols 106a, 106b, and 106c occur the least frequently of all the symbols represented in the sorter.

When two or more symbols are determined to have equal weights, these symbols may be arranged within the sorter arbitrarily or according to their lexical value, with these lexical values serving as a type of tie-breaker. In the sorter state 116a, the symbols 106a and 106b are assumed to have the same weights, but the symbol 106a has lower lexical value than the symbols 106b.

FIG. 8 also illustrates a branch-leaf stack structure that is associated with the sorter 114. FIG. 8 provides five examples of the branch-leaf stack structure, several states of which are denoted at 802a, 802b, 802c, 802d, and 802n. These states of the branch-leaf stack are associated with corresponding states of the sorter, as denoted at 114a, 114b, 114c, 114d, and 114n. The branch/leaf stack is described as a stack structure, but may be implemented as registers or any other appropriate memory.

The two symbols 106a and 106b are popped from the sorter 114a (e.g., block 602 in FIG. 6). The weights of these two symbols 106a and 106b are added (e.g., block 608 in FIG. 6), resulting a combined weight of 0.2. A branch node element for these two popped symbols 106a and 106b is instantiated (e.g., block 606 in FIG. 6), as denoted in FIG. 8 at 804a. The new branch node 804a is assigned the combined weight of 0.2, as denoted at 806a, and is pushed into the sorter. At this point, the sorter state 114a may transition to a sorter state 114b.

Turning to the branch-leaf stack, it may transition from an initial empty state (802a) to the state 802b. As indicated by the label "(2L)" in block 802b, the branch-leaf stack may include an entry indicating that two leaves (106a and 106b) were popped from the sorter, as the latter passes from state 114a to 114b.

The sorter 114b is sorted based on the weights of the entries in the sorter. In this case, the weight of branch node 802a is 0.2, which equals the weight of existing symbol 106d. FIG. 8 assumes that such ties are resolved by placing the branch node in the stack above any equally-weighted leaf-node elements (e.g., 614 in FIG. 6). Afterwards, the branch node 804a appears second in the sorter state 116b, between the symbols 106c and 106d.

From the sorter state 114b, the top two elements 106c and 804a are popped, and a new branch node 804b is instantiated for them. The popped elements 106c and 804a have weights of 0.1 and 0.2, respectively. The new branch node 804b is assigned the combined weights of the popped elements 106c and 804a, (i.e., 0.3, as denoted at 806b). The new branch node 804b is then pushed back into the sorter, transitioning the sorter state 114b to a new sorter state 114c, with the popped branch node 804b replacing the symbols 106c and 804a.

Turning to the branch-leaf stack, it may transition from state 802b to the state 802c. As indicated by the label "(3L)" in block 802c, the branch-leaf stack may include an entry indicating that a total of three leaves have been popped from the sorter, including the two leaves 106a and 106b from the sorter state 114a and the leaf 106c from the sorter state 114b. As indicated by the label "(1L)" in block 802c, the branch-leaf stack may also indicate that the branch node 804a was popped from the sorter 114b, with a corresponding representation of the popped branch node 804a being pushed into the branch-leaf stack 802c.

In the sorter state 114c, the entries are sorted according to weight, resulting in the branch node 804b (weight 0.3) being located between the leaves 106d (weight 0.2) and 106n (weight 0.5). From the sorter state 114c, the top-two entries 106d and 804b are popped, and a new branch node 804c is instantiated for these two popped entries 106d and 804b. The two popped entries 106d and 804b have weights of 0.2 and 0.3, respectively, so the new branch node 804c is assigned a combined weight of 0.5, as denoted at 806c. The new branch node 804c is then pushed back into the sorter, transitioning the sorter state 114c to a new sorter state 114d, with the branch node 804c replacing the popped entries 106d and 804b.

As shown at 114d, the branch node 804c has the same weight as the symbol 106n (i.e., 0.5). As described above, the implementation in FIG. 8 assumes that the new branch node is placed above the existing symbol (e.g., block 614 in FIG. 6), resulting in the sorter state 114d.

Turning to the branch-leaf stack, it may transition from the state 802c to the state 802d. As indicated by the label "(1L)" in block 802d, the branch-leaf stack may include an entry indicating that one leaf (106d) was popped from the sorter, as the latter passes from state 114c to 114d. As indicated by the label "(1B)" in block 802d, the branch-leaf stack may also include an entry indicating that one branch node (804b) was popped from the sorter during this same sorter transition. When the branch node 804b is popped, the branch-leaf stack stops counting leaves, pushes the leaf representation (1L) onto the stack, and then pushes on the branch representation (1B).

In the sorter state 114d, only two entries remain. These two entries are popped from the sorter, and their weights are added resulting in a combined weight of 1.0. A new branch node 804d is instantiated for the two popped entries, and the branch node 804d is assigned the combined weight of 1.0, as indicated at 706d. Additionally, under the weighting scheme used in these examples, a branch node weight of 1.0 indicates that the sorter has been completely processed (e.g., Yes branch 624 in FIG. 6). In this event, the new branch node 804d is then pushed back into the sorter, transitioning the sorter state 114d to a final sorter state 114n, with the branch node 804d replacing the popped entries 804c and 106n. Additionally, the branch node 804d is designated as the root node for the tree being constructed. In implementation, it is not necessary to push the root node 804d back onto the sorter as there is nothing to sort, so the root node can be discarded.

Turning to the branch-leaf stack, it may transition from the state 802d to the state 802n. As indicated by the label "(2B)" in block 802n, the branch-leaf stack may include an entry indicating that one branch (804c) was popped from the sorter, as the latter passes from state 114d to 114n. Because the branch-leaf stack was counting branches in the state 802d, the branch-leaf stack adds this new branch to the previously-counted branch, resulting in the designation (2B) as shown in 802n. As indicated by the label "(1L)" in block 802n, the branch-leaf stack may also include an entry indicating that one leaf node (106n) was popped from the sorter after the branch node 804c was popped. When the leaf node 106n is popped, the branch-leaf stack stops counting branches, pushes the branch representation (2B) onto the stack, and then pushes on the leaf representation (1L).

FIG. 9

Figure 9:
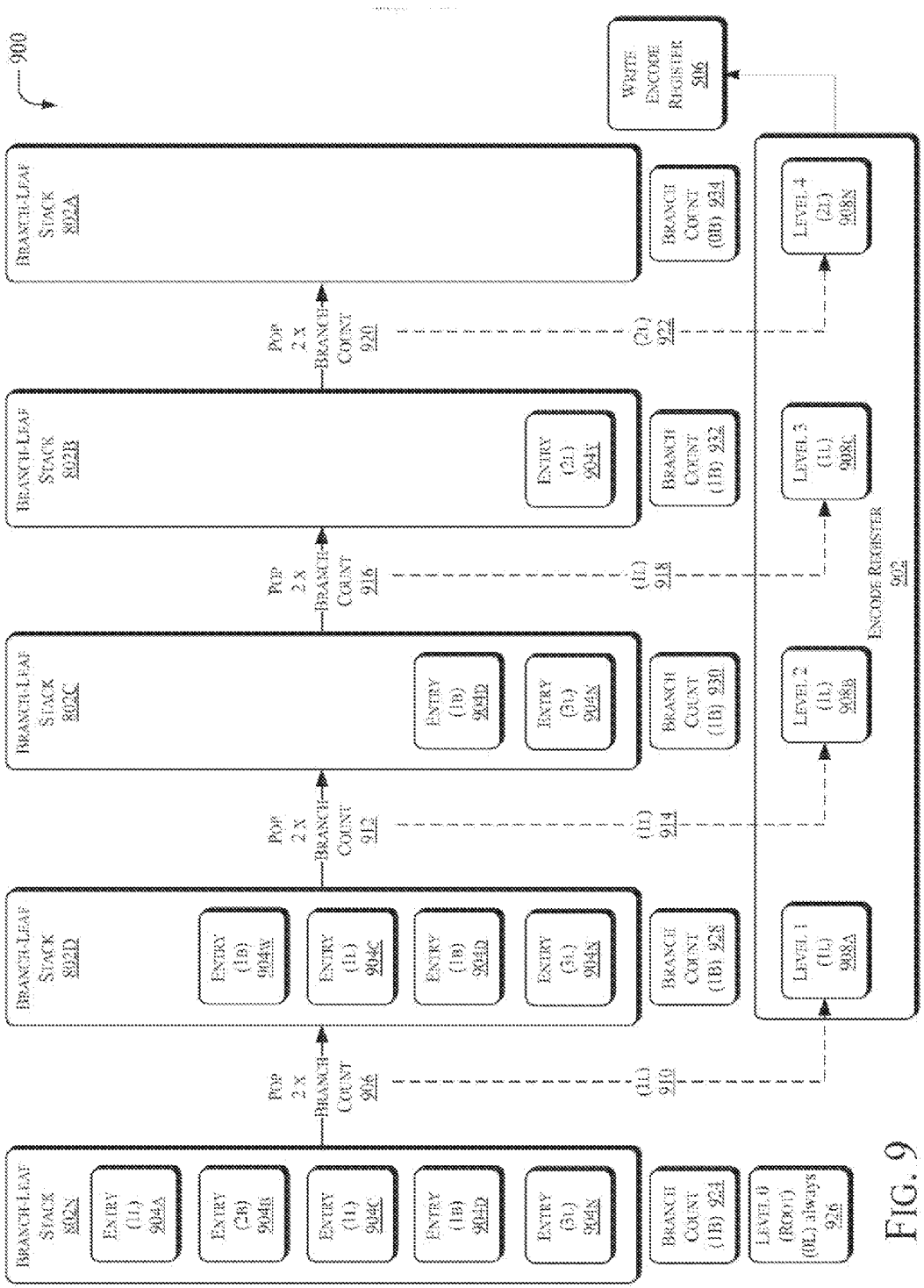
FIG. 9 is a sequence diagram illustrating how the branch-leaf stack structure constructed in FIG. 8 may be used to populate an encode register.

FIG. 9 illustrates examples, denoted generally at 900, of how the branch-leaf stack structure constructed in FIG. 9 may be used to populate an encode register 902. In turn, the encode register specifies how many leaf nodes appear at different levels of a Huffman tree, and is thus used to generate the trees.

More specifically, FIG. 9 illustrates several states of the branch-leaf stack, denoted at 802n and 802d-802a, along with corresponding entries in the encoding register. Other items introduced previously may be carried forward into FIG. 9 and denoted by similar reference numbers, only for ease of description, but not to limit possible implementations.

Turning to FIG. 9 in more detail, this figure carries forward from FIG. 8 the branch-leaf stack in the state 802n, to provide a starting point for the description of FIG. 9. It is noted that these examples are illustrative in nature, rather than limiting, and that implementations of this description may process a branch-leaf stack having contents other than the ones shown in these examples.

In the illustrative initial state 802n, the branch-leaf stack may contain five entries, denoted respectively at 904a-904n (collectively, branch-leaf stack entries 904). Assuming hardware implementations, these entries may correspond to registers or other storage elements in a memory. In software implementations (which in some cases may simulate hardware implementations), these elements may correspond to variables or data structures.

FIG. 9 labels the entries to indicate whether they represent branch or leaf nodes ("B" or "L"), as well as indicating how many nodes these entries represent (expressed as an integer). For example, the entry 904a contains one leaf node (1L), the entry 904b contains two branch nodes (2B), the entry 904c contains one leaf node (1L), the entry 904d contains one branch node (1B), and the entry 904n contains three leaf nodes (3L).

From the initial state 802n, the branch-leaf stack may pop the top two entries, as denoted at 906, because the root node is a single branch node and will have two nodes connected to it. The pop 906 may transition the branch-leaf stack from the state 802n to 802d. The pop 906 also removes the entry 904a, which represents one leaf node, and removes one of the two branch nodes represented by the entry 904b. Thus, the branch-leaf stack 802d contains an updated entry 904w representing one branch node, along with the entries 904c-904n, which are carried forward unchanged from the previous state 802n.

Turning now to the encode register 902 in more detail, this register may include entries or storage locations that correspond to levels within a tree structure (e.g., a Huffman tree) that is built based on the contents of the branch-leaf stack. In turn, Huffman codes may be assigned based on the contents of the encode register. More specifically, entries in the encode register may indicate how many leaves appear in the tree at the levels corresponding to the entries.

In FIG. 9, the tree is assumed to have four levels, excluding the root level, with the resulting Huffman code having a maximum length of four bits. However, it is noted that implementations of the description herein may include trees and code lengths having any suitable depth or length, as appropriate in different applications. As shown, the encode register may include four entries, denoted respectively at 808a-808n (collectively, encode register entries 808). These entries 808a-808n correspond to respective levels in the tree, with the entry 808a indicating how many leaves appear in the first level of the tree, the entry 808b indicating how many leaves appear in the second or next deeper level, and so on until the deepest level of the tree (level "4" in FIG. 9). The branch count register 924 is initially 1 to represent the root of the tree. It is updated at each level of the tree to determine the number of the nodes at the next level down. It is not necessary to store the branch count in the encode register since it is sufficient to know how many leaves are on each level.

Recall that the first two entries popped from the branch-leaf stack 802n included the leaf node 904a and one of the branch nodes 904b. In response to popping the leaf node, the branch-leaf stack may update the entry 808a in the encode register 902 to indicate that the current level of the tree (the "root" level) is to contain one leaf node (1L). FIG. 9 denotes this update by the dashed line 910.

Popping one of the branch nodes 904b indicates that the current level of the tree, level 1, will contain a branch node as indicated by the branch count 928. The next level down will have two nodes. The number of nodes at the next level down is two times the number of branch nodes at the current level. In response to popping one of the branch nodes 904b from state 802n, the branch-leaf stack may pop the next two top entries from the stack state 802d, as denoted at 912.

The pop 912 transitions the branch-leaf stack from state 802d to 802c. From the state 802d, the next two entries popped from the branch-leaf stack are a branch node (904w), and a leaf node (904c). In response to popping the leaf node 904c, the branch-leaf stack may update the entry 908b in the encode register to indicate that the current level of the tree will contain one leaf node (1L). In the example shown, the current level is level "2", or the second level of the tree. FIG. 9 denotes this update at the dashed line 914.

Popping the branch node 904w may indicate that the current level of the tree will contain a branch node as indicated by the branch count 930. In response to popping the branch node 904w, the branch-leaf stack may pop the next two top entries, as represented at 916. The pop 916 transitions the branch-leaf stack from state 802c to 802b. From the state 802c, the pop 916 removes a branch node 904d, and removes one of the three leaf nodes represented by the entry 904n. Thus, the state 802b contains only one entry 904y, which is updated to represent two leaf nodes.

Turning to the two entries popped from state 802c, in response to popping one of the leaf nodes 904n, the branch-leaf stack may update the entry 908c in the encode register to indicate that the current level of the tree (level "3") will contain one leaf node (1L). FIG. 9 denotes this update by the dashed line 918.

Popping the branch node 904d from the state 902c indicates that the tree will contain a branch node at the current level (level "3") as indicated by the branch count 932. Accordingly, the branch-leaf stack may pop the next top two entries, as denoted at 920. The pop 920 transitions the branch-leaf stack from state 802b to 802a, and results in the two leaf nodes 904y being removed from the branch-leaf stack, resulting in an empty stack as denoted at 802A.

In response to popping the two leaf nodes 904y, the branch-leaf stack may update the entry 908n to indicate that the current level of the tree (in the example, level "4" or the deepest level of the tree) is to contain two leaf nodes (2L). FIG. 9 denotes this update at the dashed line 922.

Because the branch-leaf stack is now empty, the encode register has been completely populated. Additionally, because the branch-leaf stack did not pop any branch nodes from the state 802b, there will be no branch nodes at the current level of the tree (level "4" in this example). The encode register may now be written 506.

It is important to note the exemplary nature of these diagrams. For example, FIG. 8 shows the branch leaf stack being filled, while FIG. 9 shows the branch leaf stack being emptied. So, 802c on FIG. 8 and 802c on FIG. 9 as portrayed here will not always be in the same state.

FIG. 10

Figure 10:
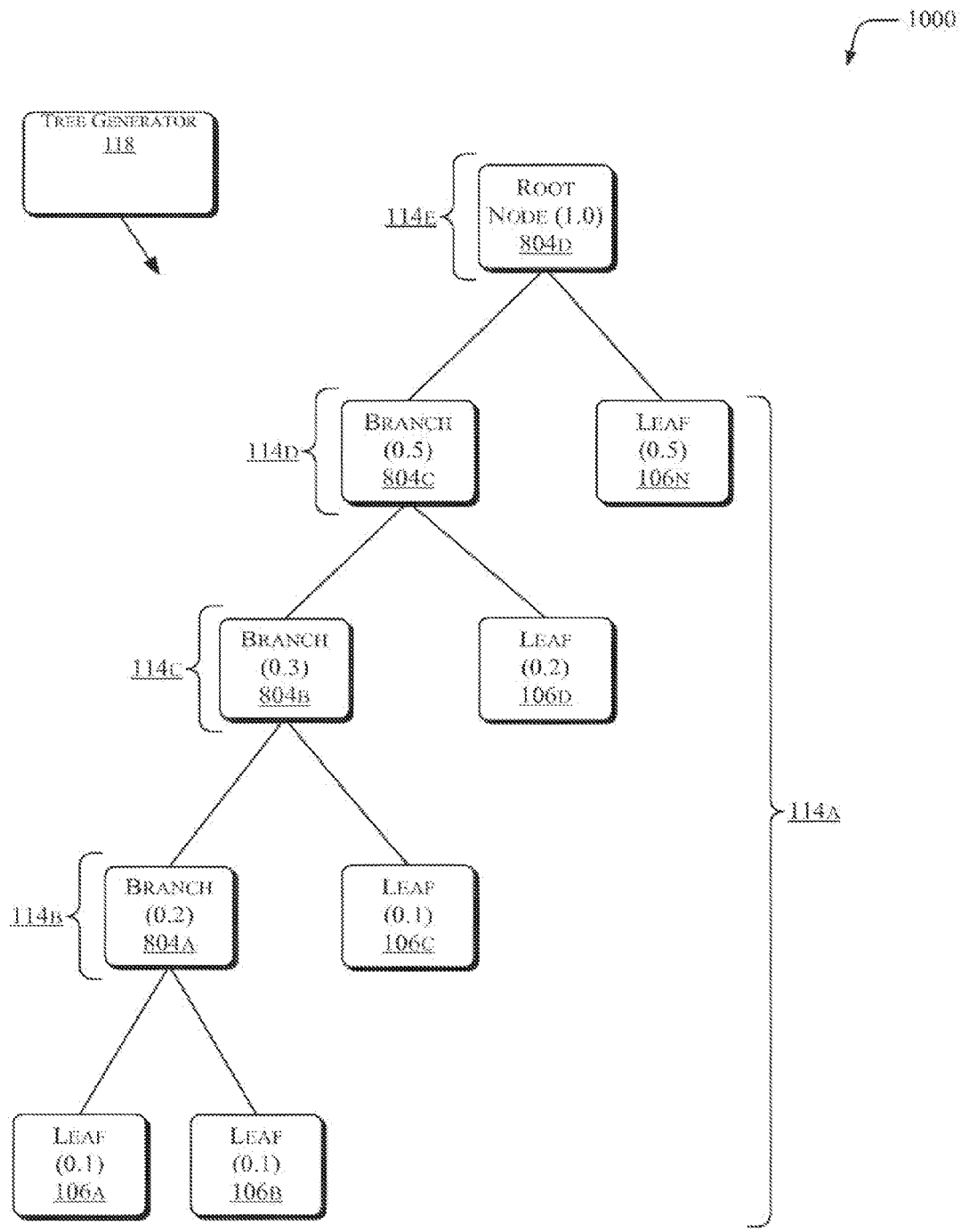
FIG. 10 is a block diagram illustrating how the exemplary Huffman tree of FIG. 8 is constructed.

FIG. 10 is a block diagram illustrating how the exemplary Huffman tree of FIG. 8 is constructed.

FIG. 10 illustrates examples of dynamic Huffman trees 1000 that may be generated using the tools described herein. For convenience and conciseness of description, but not to limit possible implementations, some items described previously are carried forward into FIG. 10 and denoted by the same reference numbers.

The trees 1000 as shown in FIG. 10 may correspond to the processes 800 shown in FIG. 8 relating to generating dynamic Huffman codes and related trees (e.g., 118). Additionally, the trees may, without limitation, result from the transitions in sorter state shown in FIG. 8. More specifically, the sorter states 114a-114e are carried forward into FIG. 10. Sorter state 114a represents the initial state in which the sorter contains the five literals, represented as leaves 106a-106n. Sorter state 114b represents the creation of the branch node 804a, sorter state 114c represents the creation of the branch node 804b, and sorter state 114d represents the creation of the branch node 804c. Finally, the sorter state 114e represents the creation of the root node 804d.

FIG. 11

Figure 11:
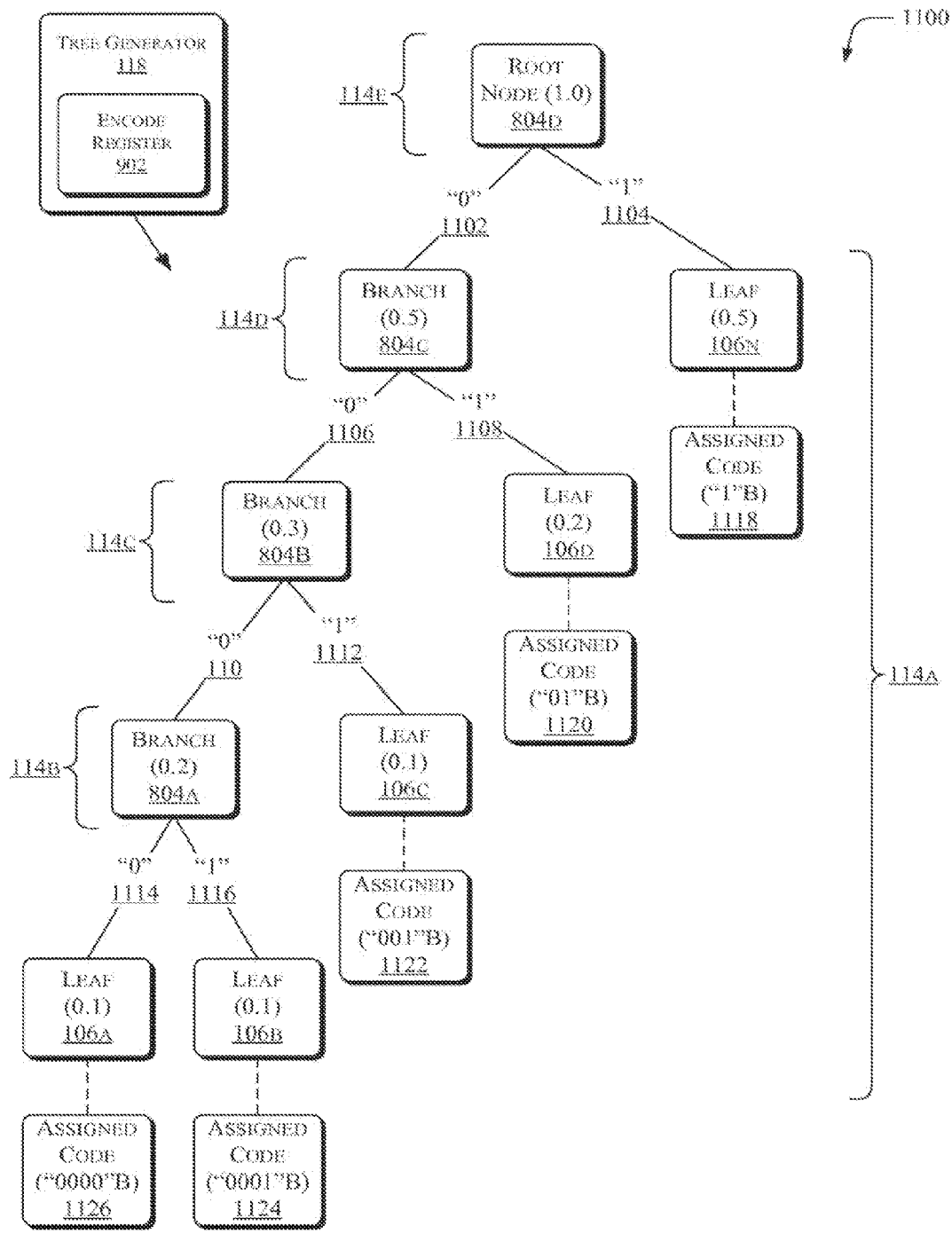
FIG. 11 is a block diagram illustrating how the leaves of the exemplary Huffman tree constructed in FIG. 8 may be assigned codes by an encode register.

FIG. 11 is a block diagram illustrating how the leaves of the exemplary Huffman tree constructed in FIG. 8 may be assigned codes by an encode register. For convenience and conciseness of description, but not to limit possible implementations, some items described previously are carried forward into FIG. 11 and denoted by the same reference numbers.

The code or tree generation process (e.g., 118) may generate the dynamic Huffman code to the leaves by assigning binary "zero" or "one" values to the links connecting various branch nodes to their leaf nodes. In addition, the tree examples 1100 elaborate further on the code assignment process. For example, beginning at the root node 804d, the code assignment or generation process may assign a "zero" value to a link 1102 from the root node 804d to the branch node 804c, and may assign a "one" value to a link 1104 from the root node 804d to the leaf 106n.

From the branch node 804c, the code generation process may assign a "zero" value to a link 1106 from the branch node 804c to the branch node 804b, and may assign a "one" value to a link 1108 from the branch node 804c to the leaf 106d.

From the branch node 804b, the code generation process may assign a "zero" value to a link 1110 from the branch node 804b to the branch node 804a, and may assign a "one" value to a link 1112 from the branch node 804b to the leaf 106c.

From the branch node 804a, the code generation process may assign a "zero" value to a link 1114 from the branch node 804a to the leaf 106a, and may assign a "one" value to a link 1116 from the branch node 804a to the leaf 106b.

It is noted that the assignments of "zero" and "one" binary values as shown in FIG. 11 could readily be reversed, if appropriate in different implementations. For example, the link 1102 could be assigned a "one" value, the link 1104 could be assigned a "zero" value, and so on. Thus, the bit assignments shown in FIG. 11 are illustrative, but not limiting.

To ascertain the respective dynamic Huffman codes assigned to the leaves 106a-106n, the code generation process may traverse the tree from the root node 804d to each of the leaves 106a-106n. Recall that the weights assigned to the leaves 106a-106n reflect how frequently the literals represented by those leaves occur in a given block. The leaf 106n has the highest weight (0.5), which indicates that it occurs most frequently in the block. As indicated by traversing from the root node 804d to the leaf 106n via the link 1104, the leaf 106n is encoded with the binary bit string "1". FIG. 11 denotes this assigned bit string at 1118.

In similar manner, the leaf 106d is assigned the bit string "01", as shown at 1120. The leaf 106c is assigned the bit string "001", as shown at 1022. The leaf 106b is assigned the bit string "0001", as shown at 1124, and the leaf 106a is assigned the bit string "0000", as shown at 1126.

Having described the code assignments shown in FIG. 11, several observations are noted. The leaves with the highest weights occur more frequently, and these leaves are encoded with the shortest bit strings. For example, the leaf 106n occurs most frequently, and is encoded with a bit string including only a single bit. Conversely, the leaves that occur less frequently are assigned longer bit strings. If the code assignment process is deployed to compress a set of input symbols, then the code assignment process enhances the efficiency of the compression by encoding the leaves that occur most frequently with the shortest bit strings.

As described previously, FIGS. 8-11 pertain to scenarios in which branch nodes having weights equal to existing entries in the sorter are placed above those existing entries, as represented generally at block 614 in FIG. 6. FIGS. 12-15 illustrate how the sorter states, code trees, and code assignments may be changed if the branch nodes are placed below these existing entries in the sorter, as represented generally at block 616 in FIG. 6.

FIG. 12

Figure 12:
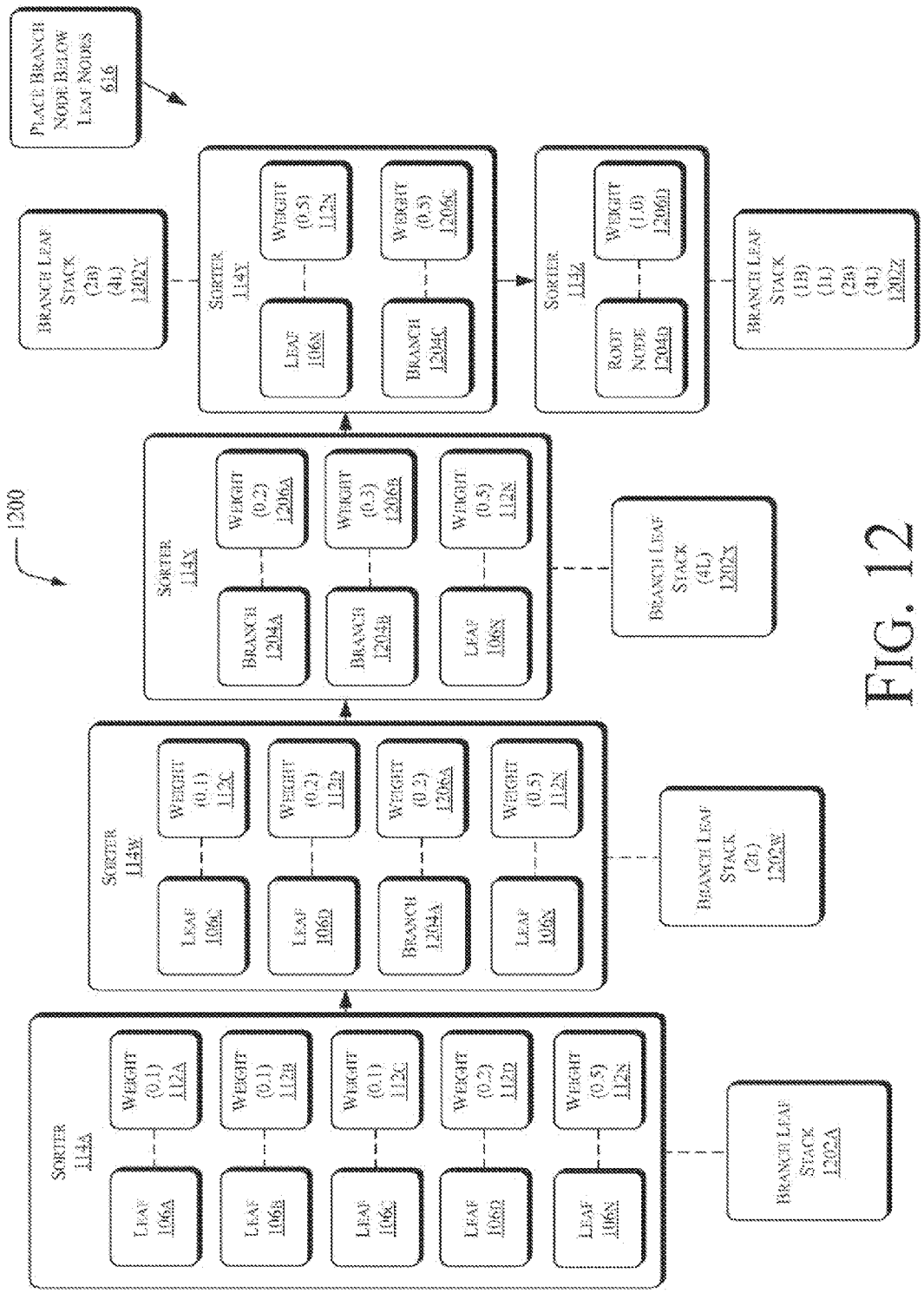
FIG. 12 is a sequence diagram illustrating different states through which the sorter and branch/leaf stack may progress as dynamic Huffman codes are generated compared to FIG. 8.

FIG. 12 illustrates another set of states 1200 through which the sorter may pass as processes for generating dynamic Huffman codes execute. For convenience and conciseness of description, but not to limit possible implementations, some items described previously are carried forward into FIG. 12 and denoted by the same reference numbers.

FIG. 12 illustrates a branch-leaf stack structure that is associated with the sorter 114. FIG. 12 provides five examples of the branch-leaf stack structure, several states of which are denoted at 1202a, 1202w, 1202x, 1202y, and 1202z. These states of the branch-leaf stack are associated with corresponding states of the sorter, as denoted at 114a, 114w, 114x, 114y, and 114z.

Sorter state 114a is carried forward from FIG. 8, and contains the same example elements described above in FIG. 8. As before, the two lowest stack entries (106a and 106b) are popped from the sorter and replaced with a branch node, denoted in FIG. 12 at 1204a. The new branch node 1204a has a weight of 0.2 (1206a), which is equal to the weight of existing leaf 106d. In FIG. 8, the new branch node 804a was placed above the existing leaf 106d. However, in FIG. 12, the new branch node 1204a is placed below the existing leaf 106d, as shown at sorter state 114w.

Turning to the branch-leaf stack, it may transition from an initial empty state 1202a to the state 1202w, as the sorter transitions from state 114a to 114w. As indicated by the label "(2L)" in block 1202w, the branch-leaf stack may count the two leaves (106a and 106b) that were popped from the sorter 114a.

From sorter state 114w, the two leaves 106c and 106d with respective weights 0.1 and 0.2 are popped from the sorter, and a new branch node 1204b is instantiated and pushed onto the sorter to replace them. The new branch node 1204b has weight 0.3, as denoted at 1206b in sorter state 114x.

Turning to the branch-leaf stack, it may transition from state 1202w to the state 1202x, as the sorter transitions from state 114w to 114x. As indicated by the label "(4L)" in block 1202x, the branch-leaf stack may continue counting leaves, since two more leaves (106c and 106d) were popped from the sorter 114w. Combined with the two leaves 106a and 106b popped previously from the sorter state 114a, the branch-leaf stack may indicate at 114x that four consecutive leaves have been popped from the sorter.

From sorter state 114x, the two branch nodes 1204a and 1204b are popped from the sorter, and a new branch node 1204c having weight 0.5 is pushed onto the sorter as a replacement. The new branch node 1204c has the same weight as the leaf 106n, and the new branch node 1204c is placed below the leaf 106n, as shown at sorter state 114y. Finally, at sorter state 114z, a new root node 1204d replaces the leaf 106n and the branch node 1204c. The root node 1204d has weight 1.0 (1206d).

Turning to the branch-leaf stack, it may transition from the state 1202x to the state 1202y, as the sorter transitions from state 114x to 114y. As the two branches 1204a and 1204b are popped from the sorter 114x, the branch-leaf stack may stop counting leaves, push the entry labeled (4L) onto the stack, and begin counting branch nodes. As indicated by the label "(2B)" in block 1202y, the branch-leaf stack may count the two branch nodes (1204a and 1204b) that were popped from the sorter 114x, as the latter passes from state 114x to 114y.

Finally, when the sorter transitions from 114y to 114z, the branch-leaf stack may transition from 1202y to 1202z. When the leaf 106n is popped from the sorter 114y, the branch-leaf stack 114z may stop counting branches, push the entry labeled (2B) onto the stack, and begin counting leaves. In this example, one leaf 106n pops from the sorter, followed by one branch node 1204c. When the branch node 1204c is popped, the branch-leaf stack 1202z stops counting leaves (at one leaf–1L), pushes the element labeled 1L onto the stack, and begins counting branch nodes. When the branch node 1204c is popped from the sorter, the sorter is empty, and the branch-leaf stack 1202z then pushes the entry labeled (1B) onto the stack.

FIG. 13

Figure 13:
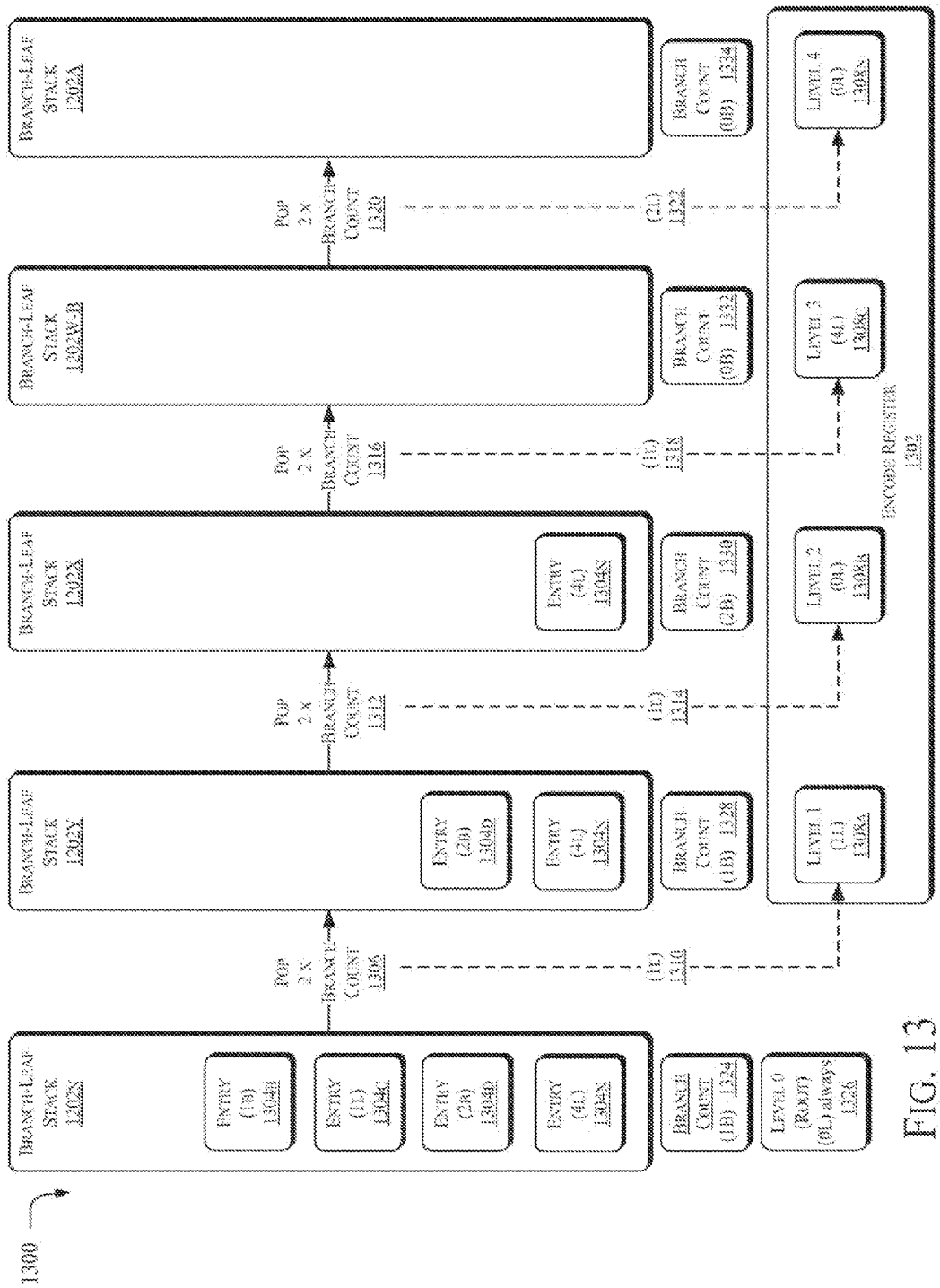
FIG. 13 is a sequence diagram illustrating how the branch-leaf stack structure constructed in FIG. 12 may be used to populate an encode register.

FIG. 13 illustrates examples, denoted generally at 1300, of how the branch-leaf stack structure constructed in FIG. 12 may be used to populate an encode register 1302. In turn, the encode register specifies how many leaf nodes appear at different levels of a Huffman tree, and is thus used to generate the trees. More specifically, FIG. 13 illustrates several states of the branch-leaf stack, denoted at 1202z, 1202y, 1202x, 1202w-b, and 1202a along with corresponding entries in the encoding register. Other items introduced previously may be carried forward into FIG. 13 and denoted by similar reference numbers, only for ease of description, but not to limit possible implementations.

Turning to FIG. 13 in more detail, this figure carries forward from FIG. 12 the branch-leaf stack in the state 1202z, to provide a starting point for the description of FIG. 13. It is noted that these examples are illustrative in nature, rather than limiting, and that implementations of this description may process a branch-leaf stack having contents other than the ones shown in these examples.

In the illustrative initial state 1202z, the branch-leaf stack may contain four entries, denoted respectively at 1304b-1304n (collectively, branch-leaf stack entries 1304). Assuming hardware implementations, these entries may correspond to registers or other storage elements in a memory. In software implementations (which in some cases may simulate hardware implementations), these elements may correspond to variables or data structures.

FIG. 13 labels the entries to indicate whether they represent branch or leaf nodes ("B" or "L"), as well as indicating how many nodes these entries represent (expressed as an integer). For example, the entry 1304b contains one branch node (1B), the entry 1304c contains one leaf node (1L), the entry 1304d contains two branch nodes (2B), and the entry 1304n contains four leaf nodes (4L).

From the initial state 1202z, the branch-leaf stack may pop two times the top two entries, as denoted at 1306. The pop 1306 may transition the branch-leaf stack from the state 1202z to 1202y. The pop 1306 also removes the entries 1304b and 1304c, which represents one leaf node and one branch node. Thus, the branch-leaf stack 1202y contains an updated entry 1304d representing one leaf node and one branch node, along with the entry 1304n, which are carried forward unchanged from the previous state 1202z.

Turning now to the encode register 1302 in more detail, this register may include entries or storage locations that correspond to levels within a tree structure (e.g., a Huffman tree) that is built based on the contents of the branch-leaf stack. In turn, Huffman codes may be assigned based on the contents of the encode register. More specifically, entries in the encode register may indicate how many leaves appear in the tree at the levels corresponding to the entries.

In FIG. 13, the tree is assumed to have three levels, with the resulting Huffman code having a maximum length of three bits. However, it is noted that implementations of the description herein may include trees and code lengths having any suitable depth or length, as appropriate in different applications. As shown, the encode register may include four entries, denoted respectively at 1308a-1308n (collectively, encode register entries 1302). These entries 1308a-1308n correspond to respective levels in the tree, with the entry 1308a indicating how many leaves appear in the first level of the tree, the entry 1308b indicating how many leaves appear in the second or next deeper level, and so on until the deepest level of the tree (level "3" in FIG. 13).

Recall that the first two entries popped from the branch-leaf stack 1202z included the branch node 1304b and one of the leaf nodes 1304c. In response to popping the leaf node, the branch-leaf stack may update the entry 1308a in the encode register 1302 to indicate that the current level of the tree (level 1) is to contain one leaf node (1L). FIG. 13 denotes this update by the dashed line 1310.

Popping one of the branch nodes 1304b indicates that the current level of the tree (the "root" level) will contain a branch node. In response to popping one of the branch nodes 1304b from state 1202z, the branch-leaf stack may pop the next two top entries from the stack state 1202y, as denoted at 1312.

The pop 1312 transitions the branch-leaf stack from state 1202y to 1202x. From the state 1202y, the next two entries popped from the branch-leaf stack are a branch nodes (1304d). In response to popping the two branch nodes, the branch-leaf stack may update the entry 1308b in the encode register to indicate that the current level of the tree will contain zero leaf nodes (0L). In the example shown, the current level is level "2", or the second level of the tree. FIG. 13 denotes this update at the dashed line 1314. The branch count is now 2B (1330).

The pop 1316 transitions the branch-leaf stack from state 1202x to 1202w-b. From the state 1202x the remaining four leaf entry 1304n is popped from the branch-leaf stack. In response to popping the entry, the branch-leaf stack may update the entry 1308c in the encode register to indicate that the current level of the tree will contain four leaves (4L). In the example shown, the current level is level "3", or the third level of the tree. FIG. 13 denotes this update at the dashed line 1318. The branch count is now 0B (1332).

Because the branch-leaf stack is now empty, the encode register has been completely populated. Additionally, because the branch-leaf stack did not pop any branch nodes from the state 1202*x*, there will be no branch nodes at the current level of the tree (level "3" in this example).

FIG. 14

Figure 14:
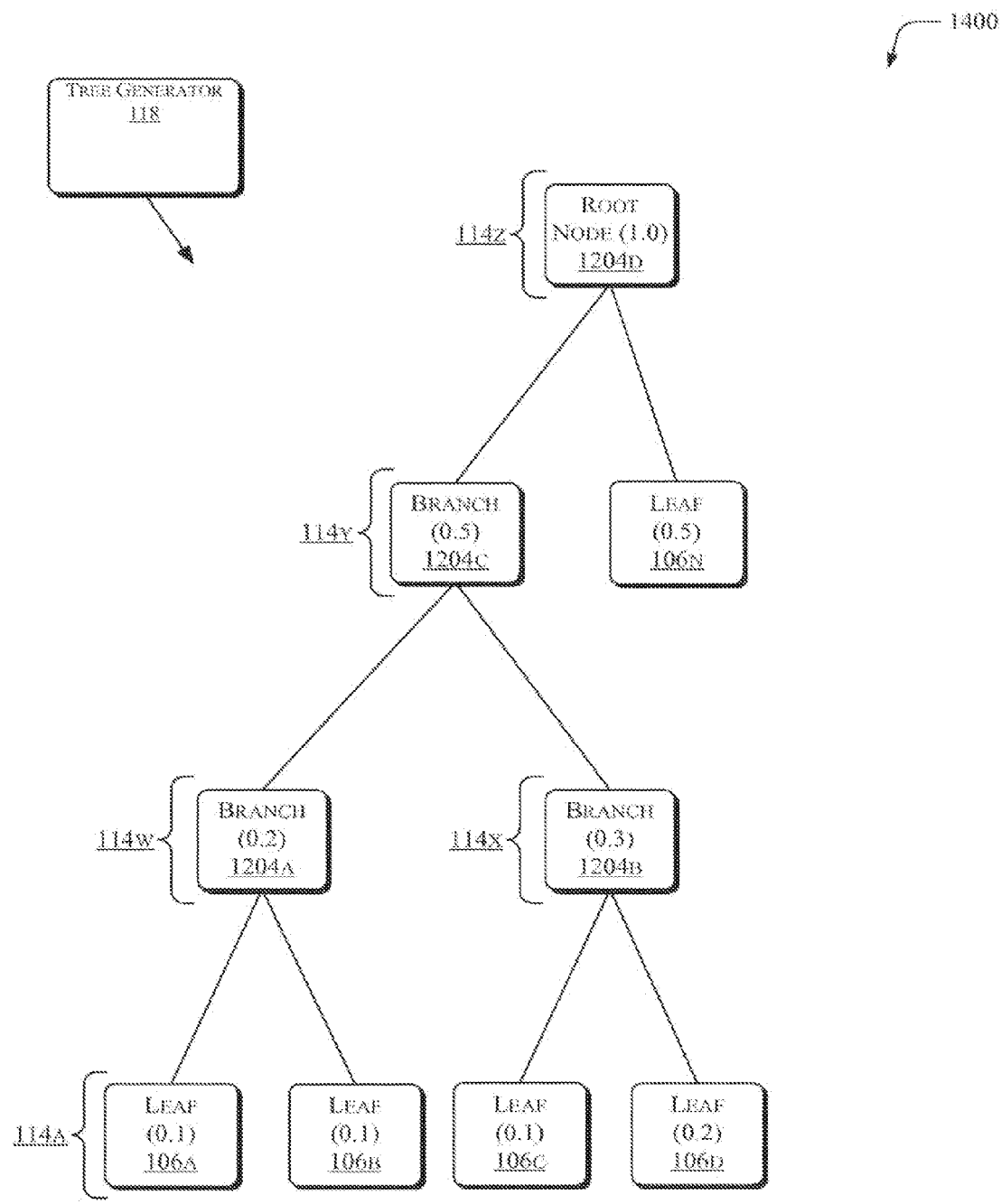
FIG. 14 is a block diagram illustrating the exemplary Huffman tree constructed in FIG. 12.

FIG. 14 illustrates additional examples of dynamic Huffman trees that may be generated in response to the sorter state transitions shown in FIG. 12. For convenience and conciseness of description, but not to limit possible implementations, some items described previously are carried forward into FIG. 14 and denoted by the same reference numbers.

In FIG. 12, state 114*a*, the sorter contains the five leaves 106*a*-106*n*, with the weights as shown in FIG. 14. In state 114*w*, the branch node 1204*a* replaces the leaves 106*a* and 106*b*, and has weight 0.2. In state 114*x*, the branch node 1204*b* replaces the leaves 106*c* and 106*d*, and has weight 0.3. In state 114*y*, the branch node 1204*c* replaces the branch nodes 1204*a* and 1204*b*, and has weight 0.5. In state 114*z*, the root node 1204*d* replaces the branch node 1204*c* and the leaf 106*n*, and has weight 1.0.

Comparing the code trees shown in FIGS. 10 and 14, it is noted that the code tree shown in FIG. 14 has less depth than the code tree shown in FIG. 10. As will be demonstrated in FIG. 15, these different code trees may result in different code assignments.

FIG. 15

Figure 15:
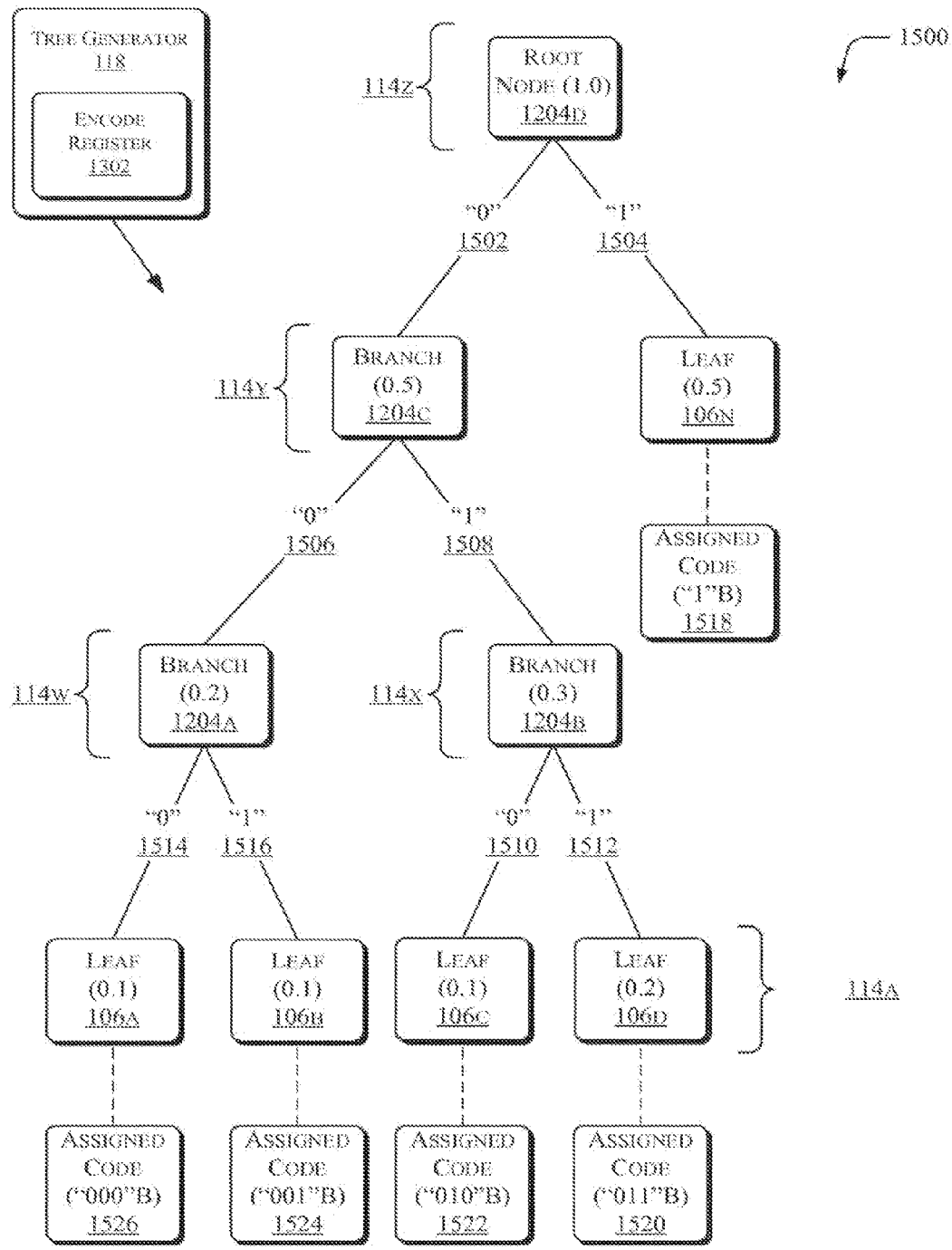
FIG. 15 is a block diagram illustrating how the exemplary Huffman tree constructed in FIG. 12 may assign codes to leaves.

FIG. 15 illustrates examples 1500 of code assignments that are possible, given the code tree shown in FIG. 14. For convenience and conciseness of description, but not to limit possible implementations, some items described previously are carried forward into FIG. 15 and denoted by the same reference numbers.

FIG. 15 illustrates code assignments that may be performed similarly to the code assignments shown in FIG. 11. Applying similar assignment methodology to the tree carried forward from FIG. 14, a code generation or assignment process (e.g., 1302) may, beginning with the root node 1204*d*, assign a "zero" to a link 1502, and may assign a "one" to a link 1504. From the branch node 1204*c*, the code generation process may assign a "zero" to a link 1506, and may assign a "one" to a link 1508. From the branch node 1204*b*, the code generation process may assign a "zero" to a link 1510, and may assign a "one" to a link 1512. From the branch node 1204*a*, the code generation process may assign a "zero" to a link 1514, and may assign a "one" to a link 1516.

Given the above bit assignments, the leaves 106*a*-106*n* may be encoded as follows. The leaf 106*n* is assigned the bit string "1", as indicated at 1518. The leaf 106*d* is assigned the bit string "011", as indicated at 1520. The leaf 106*c* is assigned the bit string "010", as indicated at 1522. The leaf 106*b* is assigned the bit string "001", as indicated at 1524. Finally, the leaf 106*a* is assigned the bit string "000", as indicated at 1526.

The same observations regarding the code assignment illustrated in FIG. 11 apply largely to the code assignment shown in FIG. 15. For example, the leaves that occur most frequently are assigned the shortest code strings, thereby enhancing coding efficiency and maximizing compression. However, the differences in the code trees are reflected in the assigned bit strings. More specifically, the maximum length of the assigned code words varies according to the depth of the code trees. Thus, in FIG. 11, the longest code word is four bits long, and the code tree shown in FIG. 11 includes at most four branch nodes in sequence (804*a*-804*d*). However, in FIG. 15, the longest code word assigned is three bits long, and the code tree includes at most three branch nodes in sequence (1204*a* or 12024, combined with 1204*c* and 1204*d*).

Having described the above tools and techniques for generating Huffman codes, the discussion now turns to a description of tools and techniques for repairing Huffman trees and codes. Given that Huffman codes may be derived from Huffman trees, this description refers to Huffman codes and related trees synonymously, for convenience, unless noted otherwise expressly or by context.

In some instances where the maximum tree depth may be constrained, the trees generated using the above techniques may or may not be valid because they can result in a tree that exceeds the maximum depth constraint. In instances where the tree is invalid, the tools and techniques may repair the Huffman. These repairs may be performed to bring the trees into compliance with pre-defined standards. As a non-limiting example of such standards, the DEFLATE data compression and decompression algorithm was jointly developed by Jean-Loup Gailly and Mark Adler and is specified in RFC 1951. The DEFLATE algorithm provides that Huffman codewords may have a limit of either 7 bits or 15 bits, in different scenarios. Thus, the Huffman trees that define these codewords would be limited to a maximum depth of, for example, 7 levels or 15 levels.

As shown in the examples in the preceding Figures, it is possible for Huffman trees to expand to somewhat arbitrary levels or depths in different scenarios. These levels or depths may exceed limits on depth or levels set by pre-defined standards (e.g., the DEFLATE algorithm). In such cases, the tools and techniques for repairing these Huffman trees may bring the Huffman trees into compliance with such pre-defined standards or limits.

In addition to bringing the trees into compliance with any predefined standards, the tools for repairing the Huffman trees may also optimize the trees to generate codes that offer improved performance in compression or decompression. It is noted that the tools described herein for repairing and/or optimizing these trees may operate within certain constraints, and may optimize the trees as well as possible within such constraints.

FIG. 16

Figure 16:
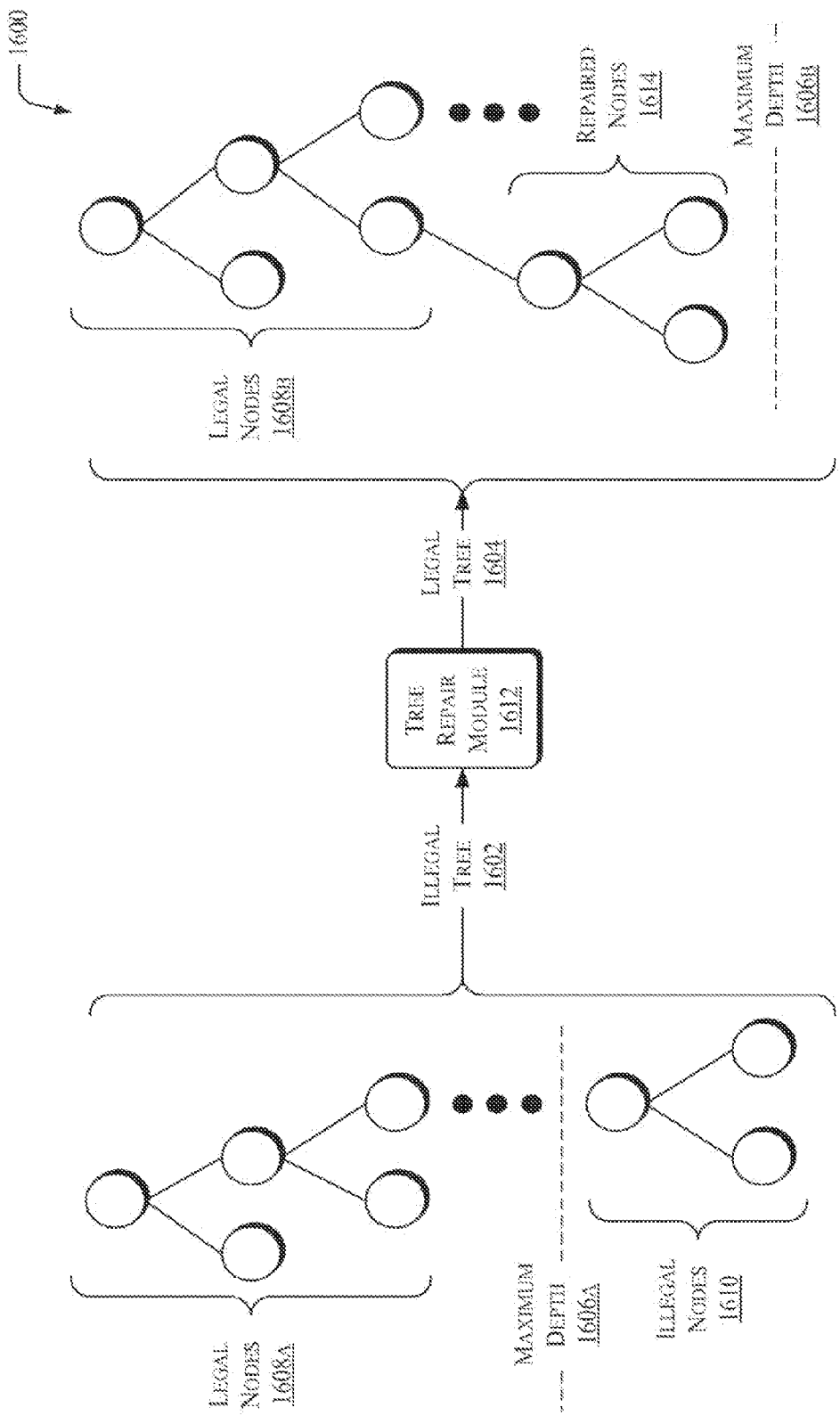
FIG. 16 is a tree diagram illustrating a repair in which the illegal tree is transformed into the legal tree.

Turning in more detail to a description of these tools for repairing the Huffman trees, FIG. 16 illustrates transformations, denoted generally at 1600, of an example illegal tree 1602 into an example legal tree 1604. The illegal tree 1602 may be "illegal" because, for example only, its depth exceeds some specified maximum limit. Trees in such a state may be characterized as having an overflowed condition. Recalling the above example of the limits specified by the DEFLATE algorithm, it is also noted that other examples of illegality are also possible. The DEFLATE algorithm is provided only as an example to aid in the description and illustration of these tools for repairing Huffman trees.

Turning to the illegal tree 1602 in more detail, FIG. 16 denotes the maximum depth of the tree at 1606*a*. Given this maximum depth, some nodes of the tree may be above this depth and thus "legal", as denoted at 1608*a*. Other nodes within the tree may be below this depth and thus "illegal", as denoted at 1610.

FIG. 16 illustrates a tree repair module 1612, which generally represents the tools and techniques described herein for repairing illegal trees 1602 into legal trees 1604. As described in more detail in FIG. 17 below, the tree repair module 1612 may be implemented as hardware and/or software.

Turning to the legal tree 1604 in more detail, the maximum level or depth is carried forward from the illegal tree 1602, and denoted at 1606*b*. Also, the legal nodes are carried forward and denoted at 1608*b*. However, in the legal tree 1604, the formerly illegal nodes 1610 in the illegal tree 1602 have been repositioned as repaired nodes 1614. Various examples and techniques for repairing the nodes 1614 are presented in the drawings below.

FIG. 17

Figure 17:
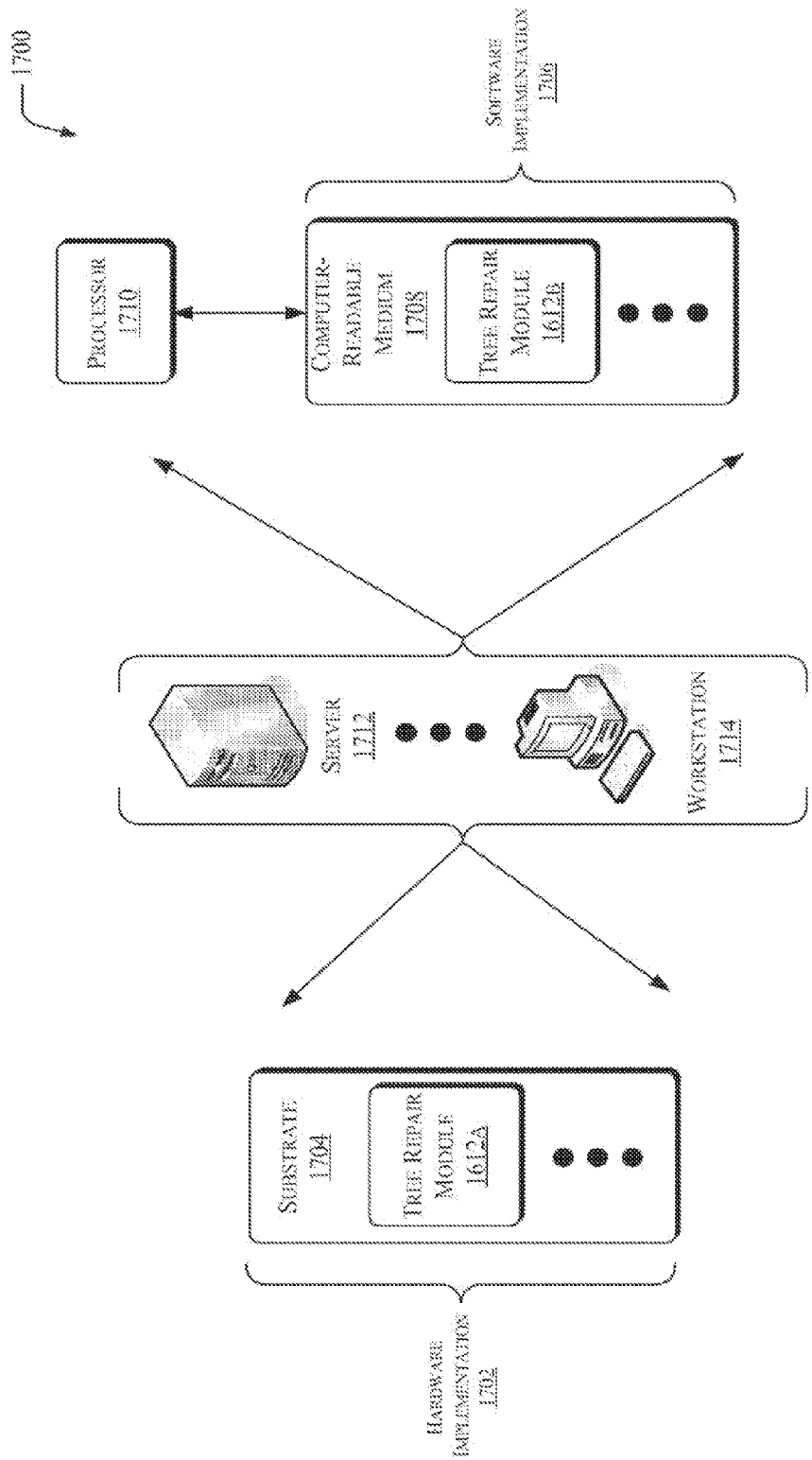
FIG. 17 is a block diagram illustrating different possible implementations of an insertion sorter and a tree generator used to generate dynamic Huffman codes.

FIG. 17 illustrates operating environments 1700 in which the tree repair module may be implemented. For convenience and conciseness of description, but not to limit possible implementations, some items described previously are carried forward into FIG. 17 and denoted by the same reference numbers.

FIG. 17 depicts hardware implementations of the tree repair module generally at 1702. The tree repair module as implemented in hardware is denoted at 1612*a*. The hardware implementations 1702 may include one or more substrates 1704 on which the tree repair module 1612*a* may reside. The substrates 1704 may include, for example, printed circuit boards or chip dies on which circuit-based implementations of the tree repair module 1612*a* may be mounted or manufactured.

FIG. 17 also depicts software implementations of the tree repair module generally at 1706. The tree repair module as implemented in software is denoted at 1612*b*. The tree repair module 1612*b* may include computer-executable instructions that may be stored in one or more computer-readable storage media 1708, and fetched into a processor 1710 and executed.

In some implementations, the computer-executable instructions may include software that simulates the performance of one or more hardware circuits that implement the tree repair module 1612*a* for design, testing, or optimization purposes. In other implementations, the computer-executable instructions may include software that, when executed by the processor 1710, cause a device or system to repair the trees as described herein.

The hardware or software implementations of the tree repair modules 1612*a* and/or 1612*b* (collectively, the tree repair modules 1612) may operate in different system environments. For example only, FIG. 17 shows a server system 1712 and a workstation 1714. The server system 1712 and/or the workstation 1714 may include the substrate 1704 and/or the computer-readable storage medium 1708.

The server system 1712 may offer computing services to one or more different users, by (for example) hosting applications, content, or media made available to the users. The server system 1712 may host, for example, a website accessible over a local or wide area network. The workstation 1714 may enable one or more users to access the applications, content, or media from the server. Thus, the server and/or the workstation may encode or compress data using any of the tools or techniques described herein for repairing trees that are created in connection with such encoding or compression.

FIG. 18

Figure 18:
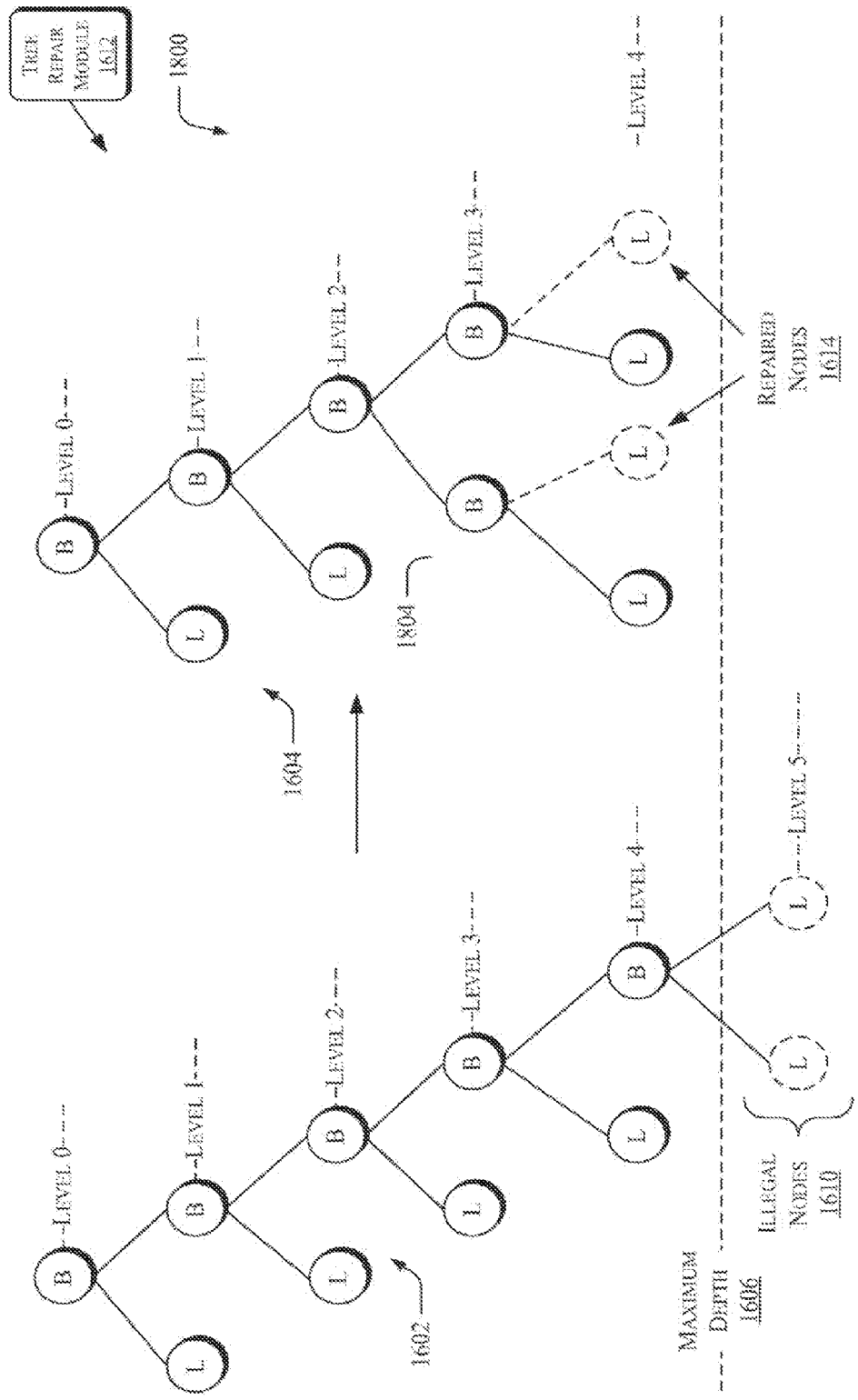
FIG. 18 is a tree diagram illustrating an illegal tree scenario, with two illegal nodes.

FIG. 18 illustrates a repair, represented generally at 1800, in which an illegal tree is transformed into a legal tree. For convenience and conciseness of description, but not to limit possible implementations, some items described previously are carried forward into FIG. 18 and denoted by the same reference numbers. For example, the tree repair module 1612 may perform the repairs illustrated in FIG. 18.

In the example shown in FIG. 18, an illegal tree 1602 includes two illegal nodes, denoted collectively at 1610, that fall below a maximum depth 1606. The illegal tree 1602 includes branch nodes that define a plurality of different depths or levels, labeled in FIG. 18 for convenience as "Level 0" through "Level 5", arranged as shown. Any leaf nodes attached to branch nodes at Levels 0-4 may be considered "legal", provided the tree is legal, while any leaf nodes attached to branch nodes at Level 5 or below may be considered "illegal".

FIG. 18 shows a tree in a graphical form. A tree can also be described by a set of registers that define the number of leaf nodes that exist at each level of the tree. Any remaining nodes at a level in the tree will be branch nodes so it is not necessary to store the number of leaves and branches at each level. An implementation could chose to store the branch nodes rather than the leaf nodes, or store both.

Assuming that the trees 1602 and 1604 are implemented as binary trees, a given branch node may have up to two nodes attached to it. These nodes may be additional branch nodes or leaf nodes. FIG. 16 denotes branch nodes by the letter "B", and denotes leaf nodes by the letter "L".

The example shown in FIG. 18, shows a legal Huffman tree that was made illegal by introducing a maximum depth to the tree. Setting maximum depth is the same as setting the maximum number of bits in a code word assigned to any leaf node. In this example, the maximum depth is set at Level 4 indicating a maximum of 4 bits can be used in a code word. The two nodes 1610 are illegal because they are below the maximum depth 1606 of the tree 1602. FIG. 18 thus illustrates a scenario, in which two illegal nodes 1610 are made legal by moving them upwards in the tree, so that they are above the maximum depth. The two repaired leaf nodes 1614 are shown on Level 4 of the repaired tree 1604. The repaired tree 1604 does not have to be constructed as shown in this example as long as no leaf nodes are below the maximum depth and it is a legal Huffman tree. The definition of a legal tree will be provided later.

The process of moving leaf nodes that are below the maximum depth 1606 to a legal location is performed by the Tree Repair Module 1612.

Figure 19:
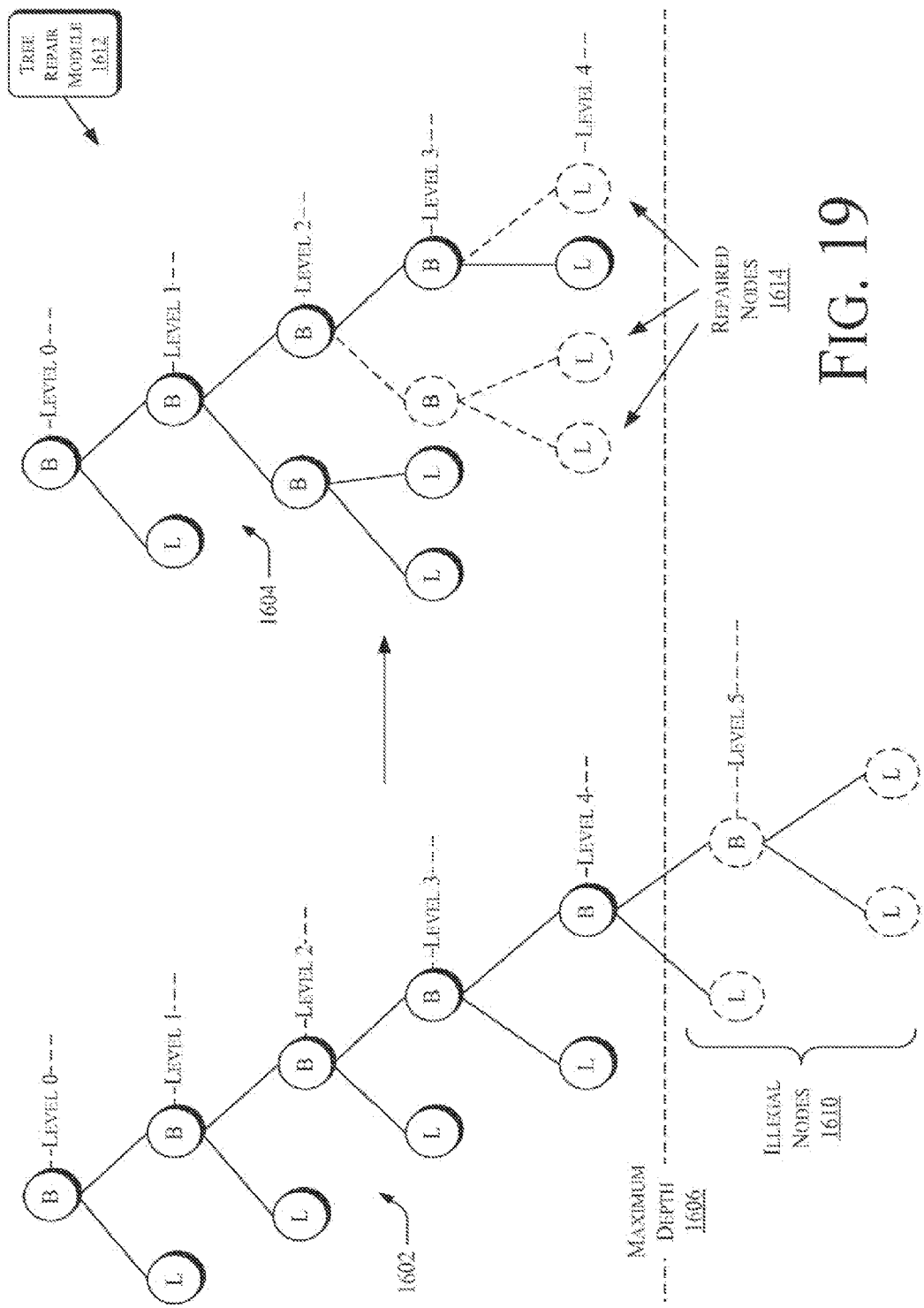
FIG. 19 is a tree diagram illustrates an illegal tree scenario with four illegal nodes.
Figure 20:
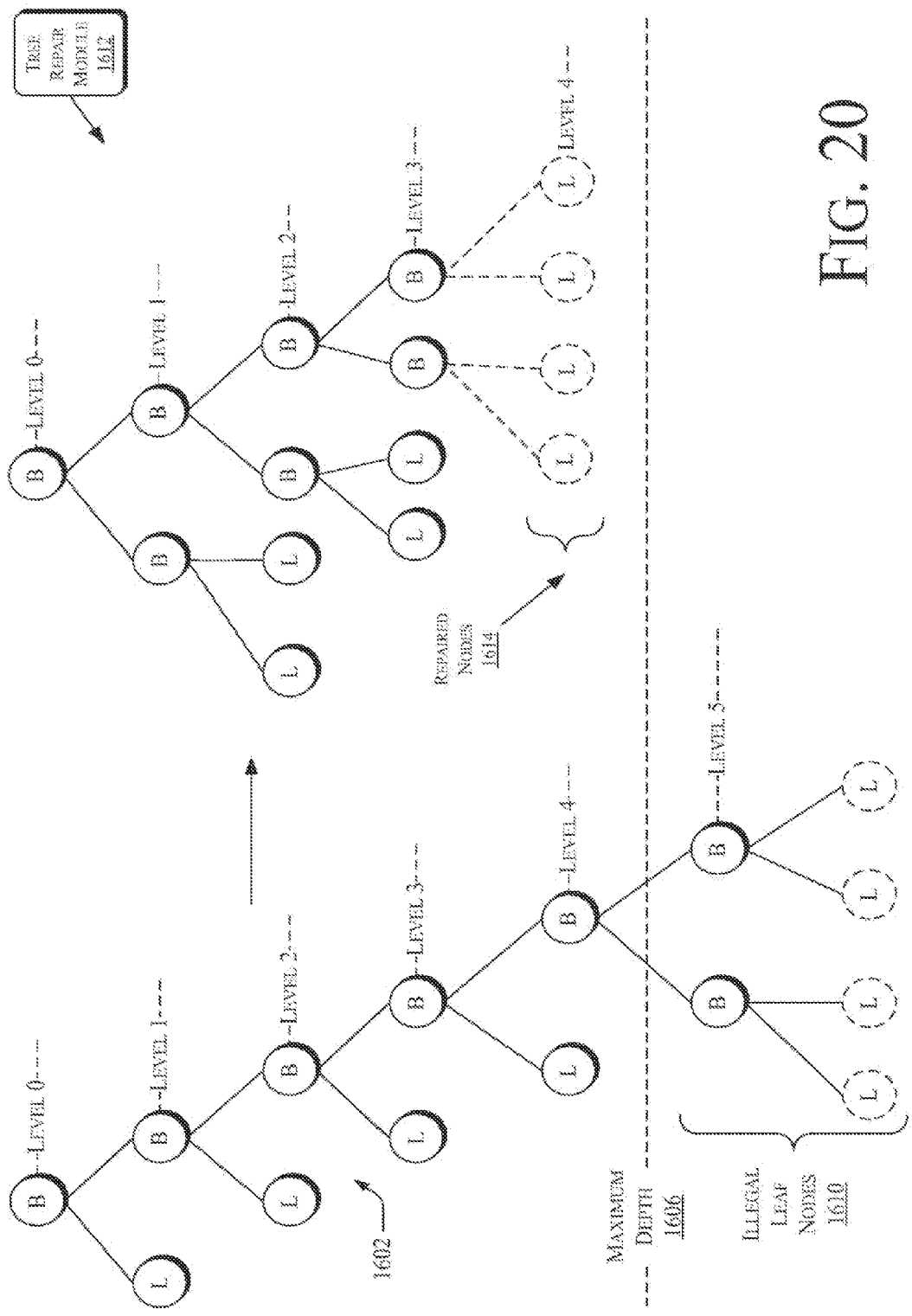
FIG. 20 is a tree diagram illustrates an illegal tree scenario with six illegal nodes.

FIGS. 19 and 20

FIGS. 19 and 20 provide additional examples of repaired Huffman trees.

Having provided the graphical representations of several examples of tree repairs shown in FIGS. 18-20 the description proceeds to a discussion of how an encoding register (e.g., 902 in FIG. 9) may be manipulated to effectuate the tree repairs described above.

FIG. 21

FIG. 21 illustrates an example, denoted generally at 2100, of altering the contents of the encode register to implement the tree repairs described in FIGS. 18-20. As such, FIG. 21 illustrates further aspects of the tree repair module 1612. For convenience and conciseness of description, but not to limit possible implementations, FIG. 21 may carry forward some items described previously, as denoted by the same reference numbers.

Turning to FIG. 21 in detail, this Figure carries forward an example of an encode register, as denoted at 902. An initial state of the encode register appears at 902*a*. The encode register may contain an arbitrary number of storage locations or entries ("N") that correspond to levels in a binary tree being constructed based on this register. N also represents the number of bits used to encode nodes at level N of the tree. In the example of FIG. 8, the encode register is building a tree of depth 4. Thus, the encode register shown in FIG. 21 includes four entries or storage locations, carried forward at 908*a*-908*n*. These storage locations, K=3 down to K=0, correspond respectively to levels 1-4 of the tree, with 4 being the deepest level. Data stored in these locations indicate how many leaf nodes are assigned to the tree level corresponding to that location. FIG. 21 denotes this number of nodes at the respective blocks 2102*a*-2102*n*.

FIG. 21 illustrates an example scenario in which block 2102a indicates that five leaf nodes appear at the deepest level of the tree, block 2102b indicates that zero leaf nodes appear at the next-higher level of the tree, block 2102c indicates that three leaf nodes appear at the next-higher level of the tree, and block 2102n indicates that zero leaf nodes appear at the highest level of the tree. Assuming that the tree is N levels deep (i.e., the Huffman codes generated for the leaf nodes may have at most N bits), a legal Huffman tree may have a codeword space of $2^N$. The example of FIG. 21 assumes a four-level tree, with N=4. Therefore, one goal of the encode register is to create a tree whose node allocation results in a codeword space of $2^4=16$.

The codeword space of a given tree configuration is expressed by the summation:

$$\text{Codeword space} = \sum_{k=0}^{N-1} codewords_k * 2^k$$

Where $codewords_k$ is the number of leaf nodes at the level of the tree equal to the current value of k. The tree is a valid Huffman tree when the codeword space equals $2^N$.

Applying the above summation to the encode register state 902a results in a codeword space count of 17, as denoted in block 2104. This count represents a "delta" of +1. The positive delta indicating that leaf nodes should be moved "down" the tree to move the count closer to the goal of $2^N$ or 16. The magnitude indicates that the desired move is from the level k=1 to k=0; however, there are no leaves at level k=0.

To attempt to achieve this goal, the encode register may transition from a state 902a to a state 902b, by reassigning one leaf node from the level 908c to the level 908b, as represented by a dashed line 2106. Thus, the number of leaf nodes at the level 908c decreases from three to two, as indicated at 2108. Also, the number of leaf nodes at the level 908b increases from zero to one, as indicated at 2110. The levels 908n and 908a remain unchanged from encode register states 902a to 902b.

From encode register state 902b, repeating the summation above results in an updated codespace count of 15, as denoted at 2112. This updated count represents a delta of −1. This negative delta indicates that leaf nodes should be moved "up" the tree to move closer to the goal count of 16. The magnitude indicates that the desired move is from level k=0 to level k=1.

To attempt to achieve this goal, the encode register may transition from a state 902b to a state 902c, by reassigning one leaf node from the level 908a to the level 908b, as represented by a dashed line 2114. Thus, the number of leaf nodes at the level 908b increases from one to two, as indicated at 2116. Also, the number of leaf nodes at the level 908a decreases from five to four, as indicated at 2118. The levels 908n and 908c remain unchanged from encode register states 902b to 902c.

From encode register state 902c, repeating the summation above results in an updated codespace count of 16, as denoted at 2120. This updated count represents a delta of 0, and indicates that a tree based on these leaf allocations would be legal.

FIG. 21 shows examples indicating how the delta value may be adjusted depending on whether leaf nodes are moved up and/or down the tree. Generalizing from these examples, in positive-delta scenarios, the codespace count may be decreased by $(2^k_{(initial\ level)} - 2^k_{(reassigned\ level)})$ times the number of leaf nodes moved, where the initial level represents the location where the leaf was prior to the move and the reassigned level the leaf was moved to. Additionally, in negative-delta scenarios, the codespace count may be increased by $(2^k_{(reassigned\ level)} - 2^k_{(initial\ level)})$ times the number of leaf nodes moved.

In the examples shown in FIG. 21, only one bit is moved as the encode register transitions from state to state. However, in other scenarios, multiple leaf nodes may be moved, by reassigning multiple bits between various entries in the encode register. Algorithms implemented in hardware and/or software may analyze the codespace count, compare it to the $2^N$ goal value, and select one or more appropriate leaf nodes to move, or move one leaf node more than one level, to drive the delta value to zero. Additionally, while multiple moves are shown to illustrate the results of moving nodes up or down the tree, these algorithms may identify moves that correct the tree in one iteration, and that may be performed in one clock pulse.

FIG. 22

Figure 22:
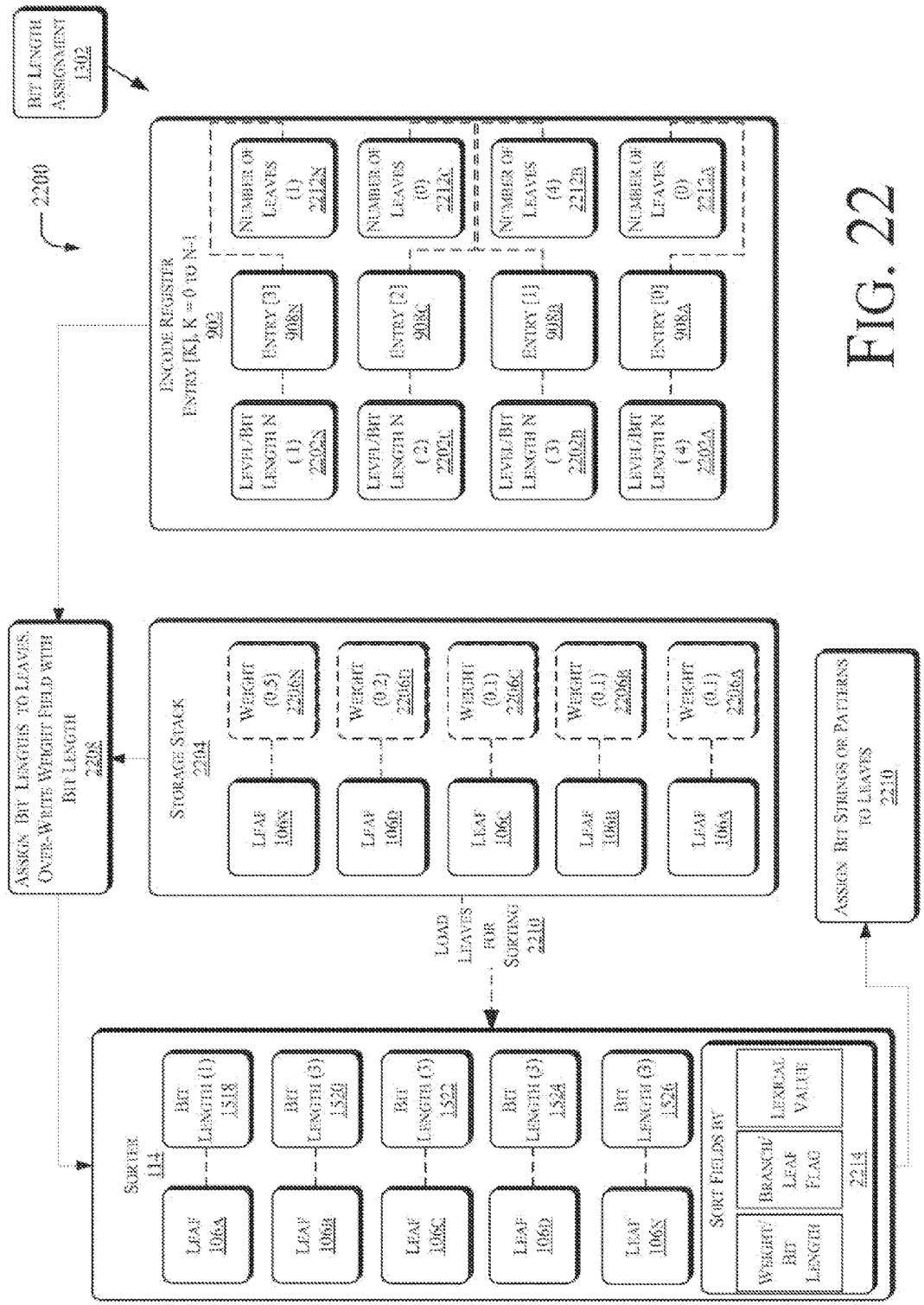
FIG. 22 is a block diagram illustrating how codeword bit lengths are assigned to leaf nodes, and sorted by bit length and lexical value

FIG. 22 illustrates components and signal flows, denoted generally at 2200, for assigning bit values to particular leaf nodes. For convenience and conciseness of description, but not to limit possible implementations, some items described previously may be carried forward into FIG. 22 and denoted by the same reference numbers. In those instances where the trees are initially illegal, the components and signal flows shown in FIG. 22 may operate after the encode register is altered to repair the illegal trees.

An example of an insertion sorter is carried forward into FIG. 22 at 114, although this sorter need not necessarily be the same insertion sorter referenced above. An example of an encode register is also carried forward at 902. An example storage stack 604, FIG. 6, is carried forward. As before, the encode register may include N entries, with N representing the maximum depth of the tree. In FIG. 22, the tree depth is set to four (i.e., N=4), and thus the encode register may include four entries 908a-908n that correspond respectively to the four levels of the tree. The encode register may indicate how many nodes or leaves are assigned to particular levels at 2202a-2202n. In the example shown, the tree contains a total of five leaves, with level 1 of the tree assigned one leaf (2202n), and level 3 assigned four leaves (2202b).

Leaves appearing at different levels of the tree may be represented by Huffman codewords having different lengths. More specifically, the leaves assigned to level 1 may be represented with one bit, the leaves assigned to level 2 may be represented with two bits, the leaves assigned to level 3 may be represented with three bits, and the leaves assigned to level 4 may be represented with four bits. For example, one leaf could be encoded with 1-bit codewords, while the other four leaves will be encoded with 3-bit codewords.

As described above, the sorter 114 initially sorted representations of leaf nodes based on their frequencies of occurrence, as reflected in an appropriate weighting scheme. Those leaves that are closer to the bottom of the stack occur more frequently, and thus are represented by shorter bit strings to achieve greater compression. This order was reversed as the leaves were stored in the storage stack. In the storage stack the leaves that occur more frequently are at the top of the stack. Once the encode register repairs the tree (if appropriate), the storage stack may pop the leaves 106n-106a in sequence, and assign bit lengths to the leaves using the entries in the encode register. For example, the sorter may pop the leaf 106n, and refer to the encode register to determine the bit length used to encode this leaf. Starting at the top of the encode register, the first entry 908n indicates that one leaf will be encoded as a 1-bit codeword, so the leaf 106n is assigned a bit length of one.

The foregoing may be repeated for the other leaves 106d-106a in the storage stack, resulting in these leaves 106d-106a being assigned their corresponding bit lengths from the encode register. In this example, the leaves 106d-106a are assigned to 3-bit codewords. In this example, the storage stack is processed heaviest weight to lightest weight and correspondingly the encode register is processed from shortest code length to longest code length. These memories could be processed in the reverse order.

Optionally, once the codeword lengths are assigned to the leaves, the leaves may be pushed into an insertion sorter, to be sorted based on their codeword lengths and lexical value within groups of equal codeword lengths. For example, but not limitation, leaves could be pushed back into the insertion sorter 114. However, it is noted that another sorter could readily be used also.

In the example shown, the sorter 114 first sorts the leaves based on the lengths of their codeword representations. Put differently, the leaves may be sorted based on their level within the tree. This first sort results in the arrangement shown, with the top-level leaf 106a on the top of the stack and the lower-level leaves 106b-106n underneath. In some instances, one or more levels in the tree may contain multiple leaf nodes. When multiple leaves appear at the same level, the sorter may sort these multiple leaves lexically, if so specified in, for example, GZIP or DEFLATE implementations. In more generic cases, these multiple leaf nodes occurring on the same level may be left as is, and not sorted lexically. The fields 2214 of the input to the sorter can be arranged to sort first by the weight or bit length field (which ever is being used); then by the branch/leaf flag (if one is being used); then by the lexical value. With these fields defined the same sorter structure could be used for all sorting processes previously discussed. Once the leaves are assigned codeword lengths and optionally sorted, the leaves may be assigned particular bit strings or patterns 2210. For example, GZIP or DEFLATE implementations may specify particular rules for assigning the bit strings, while other implementations may be more arbitrary.

CONCLUSION

Although the system and method has been described in language specific to structural features and/or methodological acts, it is to be understood that the system and method defined in the appended claims is not necessarily limited to the specific features or acts described. Rather, the specific features and acts are disclosed as exemplary forms of implementing the claimed system and method.

In addition, regarding certain data and process flow diagrams described and illustrated herein, it is noted that the processes and sub-processes depicted therein may be performed in orders other than those illustrated without departing from the spirit and scope of the description herein. Also, while these data and process flows are described in connection with certain components herein, it is noted that these data and process flows could be performed with other components without departing from the spirit and scope of the description herein

The invention claimed is:

1. A method for generating dynamic Huffman trees using an encode register, the method comprising:
   generating a plurality of dynamic Huffman codes using an insertion sorter and a tree generator;
   generating a plurality of branch nodes and a branch-leaf stack based on a weighting of entries received from the insertion sorter; and
   populating an encode register using the branch stack and leaf stack.

2. The method of claim 1, wherein generating the branch and leaf stacks further comprises adding a weight of a first symbol popped from the insertion sorter to a weight of a second symbol popped from the insertion sorter to determine a combined weight.

3. The method of claim 2, further comprising assigning the combined weight to a new branch node and pushing the new branch node into the insertion sorter.

4. The method of claim 3, further comprising sorting a plurality of entries by the sorter based on the weight of each entry.

5. The method of claim 4, further comprising placing the new branch node above a leaf node having an equal weight in the stack.

6. The method of claim 4, further comprising placing the new branch node below a leaf node having an equal weight in the stack.

7. The method of claim 4, further comprising updating the encode register until the branch-leaf stack is empty.

8. The method of claim 1, further comprising specifying by the encode register a number of leaf nodes of a level of a Huffman tree.

9. The method of claim 1, further comprising determining whether a Huffman tree is illegal based on a maximum depth of the Huffman tree.

10. The method of claim 9, further comprising transforming an illegal Huffman tree into a legal Huffman tree by moving an illegal node upward to a location that is above the maximum depth.

11. A system for generating dynamic Huffman trees using an encode register, the system comprising:
   an insertion sorter configured to generate a plurality of dynamic Huffman codes;
   a tree generator configured to generate a plurality of branch nodes and a branch-leaf stack based on a weighting of entries received from the insertion sorter; and
   an encode register configured to be populated with entries from the branch-leaf stack.

12. The system of claim 11, wherein the tree generator is further configured to add a weight of a first symbol popped from the insertion sorter to a weight of a second symbol popped from the insertion sorter to determine a combined weight.

13. The system of claim 12, wherein the tree generator is further configured to assign the combined weight to a new branch node and push the new branch node into the insertion sorter.

14. The system of claim 13, wherein the tree generator is further configured to sort a plurality of entries by the sorter based on the weight of each entry.

15. The system of claim 14, wherein the tree generator is further configured to place the new branch node above a leaf node having an equal weight in the stack.

16. The system of claim 14, wherein the tree generator is further configured to place the new branch node below a leaf node having an equal weight in the stack.

17. The system of claim 14, wherein the tree generator is further configured to update the encode register until the branch-leaf stack is empty.

18. The system of claim 11, wherein the encode register is further configured to specify a number of leaf nodes of a level of a Huffman tree.

19. The system of claim 11, further configured to determine whether a Huffman tree is illegal based on a maximum depth of the Huffman tree.

20. The system of claim 19, further comprising a tree repair module configured to transform an illegal Huffman tree into a legal Huffman tree by moving an illegal node upward to a location that is above the maximum depth.

* * * * *